United States Patent [19]
Houghton et al.

[11] Patent Number: 5,592,734
[45] Date of Patent: *Jan. 14, 1997

[54] METHOD AND APPARATUS FOR FRAMING A FILM MOUNTED INTEGRATED CIRCUIT

[75] Inventors: Jon C. Houghton, Auburn, Wash.; Chester H. Petry, Jr., Tigard, Oreg.

[73] Assignee: Byers Industries, Inc., Portland, Oreg.

[*] Notice: The portion of the term of this patent subsequent to Oct. 12, 2010, has been disclaimed.

[21] Appl. No.: 136,086

[22] Filed: Oct. 12, 1993

Related U.S. Application Data

[63] Continuation of Ser. No. 671,681, filed as PCT/US89/03285, Aug. 2, 1989, Pat. No. 5,251,372, which is a continuation-in-part of Ser. No. 228,365, Aug. 3, 1988, Pat. No. 4,949,159.

[51] Int. Cl.⁶ .................................................. H01R 43/00
[52] U.S. Cl. ................... 29/827; 29/564.3; 29/564.4; 29/704; 29/710
[58] Field of Search ..................... 29/827, 564.3, 29/564.4, 704, 710; 174/52.4, 52.2

[56] References Cited

U.S. PATENT DOCUMENTS

| | | |
|---|---|---|
| 4,007,479 | 2/1977 | Kowalski . |
| 4,068,767 | 1/1978 | Tippetts . |
| 4,069,496 | 1/1978 | Kowalski ........................ 174/52.4 X |
| 4,236,301 | 12/1980 | Hug et al. .......................... 29/564 X |
| 4,236,306 | 12/1980 | Hug et al. .......................... 29/704 X |
| 4,547,794 | 10/1985 | Tong ................................ 174/52.4 X |
| 4,696,526 | 9/1987 | Newton et al. .................... 174/52.4 X |

*Primary Examiner*—Carl J. Arbes
*Attorney, Agent, or Firm*—Marger, Johnson, McCollom & Stolowitz, P.C.

[57] ABSTRACT

A TAB carrier for film-mounted integrated circuits comprises a body member having a rectangular cavity for receiving a TAB segment of a flexible film strip and a retainer member shaped and sized to fit conformably within the cavity, each integrally molded of a resilient polymeric material. A fully automated TAB framer includes a pair of vertically-oriented pneumatic rams having vacuum operated pick up heads on the lower ends thereof. A cutting assembly cuts TAB segments from the film strip. The rams are laterally shiftable between two positions for picking up TAB segments, placing a segment in a carrier body, picking up a retainer member and inserting the retainer member into the carrier body thereby forming a framed TAB segment.

16 Claims, 19 Drawing Sheets

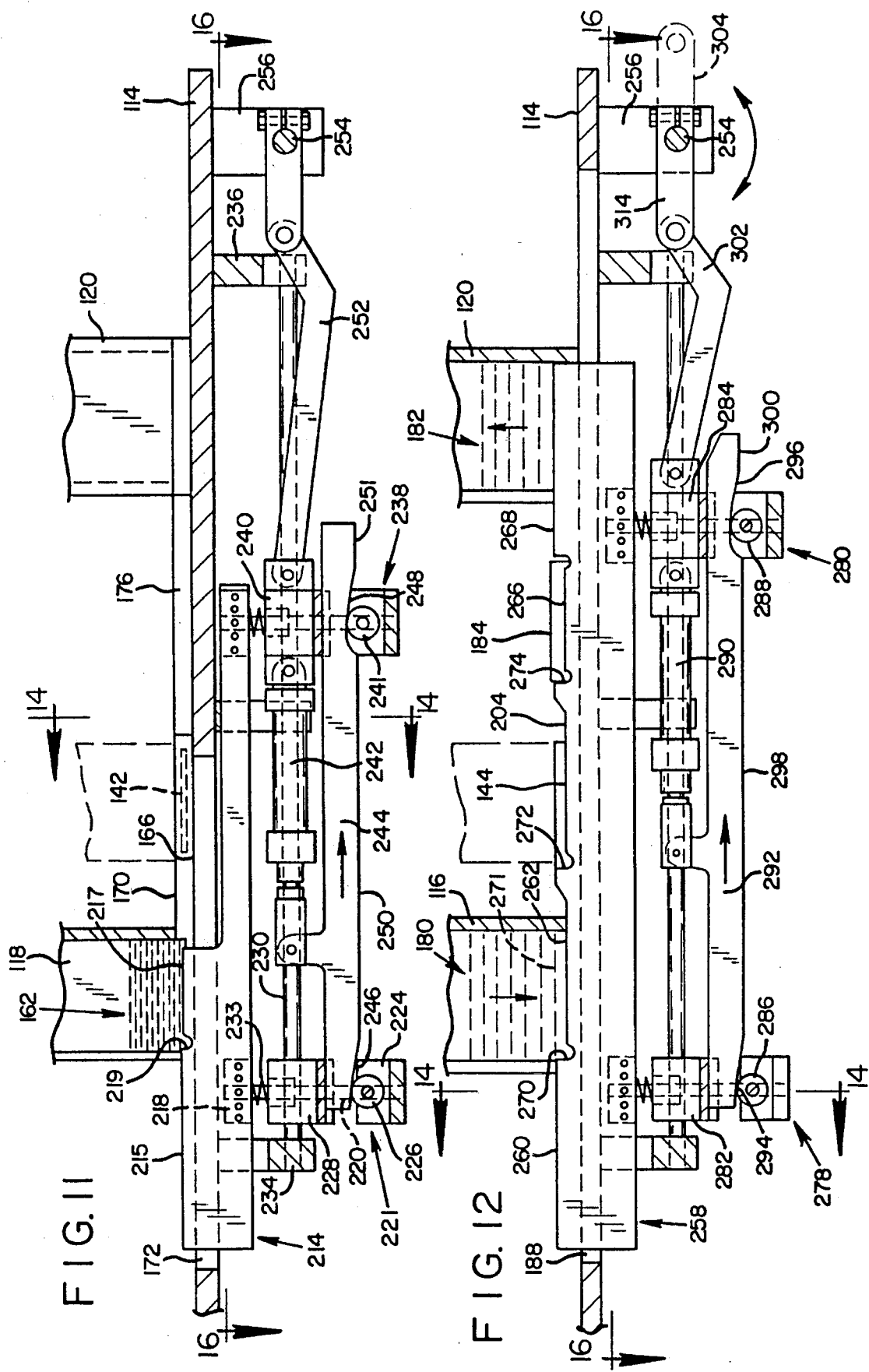

METHOD AND APPARATUS FOR FRAMING A FILM MOUNTED INTEGRATED CIRCUIT

RELATED APPLICATION DATA

This is a continuation of application Ser. No. 07/671,681, filed Mar. 5, 1991, based on International Application PCT/US89/03285, now U.S. Pat. No. 5,251,372, issued Oct. 12, 1993, which is a continuation-in-part of U.S. Ser. No. 07/228,365, filed Aug. 3, 1988, now U.S. Pat. No. 4,949,159.

BACKGROUND OF THE INVENTION

This invention relates to automated manufacture of integrated circuits and more particularly to a carrier for use in tape-assisted bonding (TAB) of an integrated circuit chip onto a segment of a strip of flexible film material on which an array of flexible, conductive beam leads have been formed and to a method and apparatus for framing the film segment in the carrier.

U.S. Pat. No. 4,007,479 and U.S. Pat. No. 4,069,496 to Kowalski generally describe the prior art techniques for tape-assisted bonding. Each of these patents discloses a different form of carrier in which a segment of a film strip is mounted for subsequent processing after the segment has been detached from a continuous strip of such segments.

Kowalski '479 discloses a fixture or carrier in the form of upper and lower layers, each in the form of a rectangular frame member, interconnected along one side of each of the frame members by a hinge. The frame members and hinge structure are integrally formed of plastic by injection molding. One of the layers has a rectangular cavity for receiving the segment of film strip. The cavity is formed to closely match the dimensions of the film strip. Lugs are formed in opposite lateral sides of the cavity for fitting into sprocket holes in the film strip. The frame members have openings to expose the film strip on both sides. The frame members are fastened together in overlying relationship by means of opposed concentric rings on the opposed faces of the upper and lower layers. The rings are arranged and sized to frictionally engage when nested together.

Kowalski '496 recognized that the design in the '479 patent had a number of problems and deficiencies. The '496 patent discloses a carrier or fixture composed of a single frame member having a rectangular cavity and specially formed lugs which insert through sprocket holes in the film segment. The lugs have overlapping lateral projections which are intended to retain the film segment in the carrier.

U.S. Pat. No. 4,547,794 to Tang also discloses a carrier and discusses the problems noted by Kowalski but which Tang deemed to remain unsolved. Tang proposes a carrier composed of a single frame member with a rectangular cavity for retaining a film segment. Formed integrally in the sides of the frame member are a plurality of elongated cantilevered beam members which are movable from a first position to a second position for insertion and removal of the film segment in the cavity. These beam members are integrally formed with the frame members by plastic injection molding.

Another form of carrier is supplied commercially by AMS to Digital Equipment Corp. This carrier also is composed of a single frame member having a rectangular cavity for receiving a film strip segment. This carrier differs somewhat from the above-described carriers in that it does not have lugs for insertion into the film sprocket holes. Instead, it has diagonally-oriented square lugs positioned for insertion into special positioning holes located at the four corners of each segment just inward of the sprocket holes. This arrangement is in accordance with a set of standards known as the JEDEC Standards, adopted by a group of U.S. integrated circuit manufacturers. The film segment is secured in each mount by means of four small plastic pins which are frictionally inserted into four holes in the bottom wall of the cavity of the frame member at each corner of the segment. The holes are positioned in the bottom wall of the carrier so as to align with the sprocket holes in each corner of the film segment. The pins are sized to an interference fit with the holes and have a cap which overlaps the film around each sprocket hole.

From a review of the foregoing patents, it is apparent that there is a need for a reliable method and form of carrier for mounting segments of flexible film strips or tape-assisted bonding of integrated circuits. Meeting this objective entails solving a number of rather difficult problems unique to handling integrated circuits. Moreover, the problems become increasingly difficult as the circuitry gets more complex. The examples of film segments in the Kowalski patents show circuit connections on which 40 beam leads have been formed, 10 per side. Current integrated circuit technology often calls for circuits having hundreds of beam leads. This means the beam leads must be narrower and closer together (i.e. narrower pitch) by nearly an order of magnitude compared to those shown in Kowalski. Lateral alignment is critical to ensure bonding of the beam leads to the correct locations on the integrated circuit chips.

Retaining alignment uniformly throughout each step of the process and from one carrier to the next is critical to automated processing. The film strip segments must be securely held in place for various processing steps while providing access to the beam leads for testing the connections and circuit but permit easy placement of the segment in the carrier and removal of it from the carrier after processing. The design of the carrier should permit all processing steps to be performed mechanically in a fully automated process, with a high degree of reliability.

Prior carriers do not meet these requirements sufficiently for state-of-the-art integrated circuits. Accordingly, a need remains for an improved carrier.

SUMMARY OF THE INVENTION

It is therefore an object of the invention to provide a carrier that will securely hold a segment of a flexible film strip patterned with many narrow beam leads in a predetermined position for various stages of processing including testing.

Another object is to provide a carrier that enables easy placement and removal of a film segment, without risk of inadvertent separation of the segment from the carrier.

A further object is to make it easy to test the beam leads and/or an integrated circuit bonded to the beam leads while the segment of film strip is mounted in the carrier.

Still another object is to provide a method and apparatus for fully automating the assembly of the film segment and the carrier.

The invention provides a carrier for film-mounted integrated circuits comprising a body member having a rectangular cavity for receiving a segment of a flexible film strip, a retainer member shaped and sized to fit conformably within the cavity, and complementary inter-engagement means along the interior periphery of the cavity and outer periphery of the retainer member. The inter-engagement means serve to interlock the retainer member within the body member in nested relationship with a margin of said rectangular segment sandwiched between the flat bottom wall and flat bottom face, respectively, of the body and retainer members.

The inter-engagement means is preferably formed by a series of undercut ledges spaced along the interior periphery of the cavity and complementary lips spaced along the exterior periphery of the retainer member and protruding from the outer edge faces thereof in juxtaposition with the undercut ledges for inter-engaging therewith. The undercut ledges and complementary lips are spaced depthwise of the cavity so as to provide a space between the bottom wall and the bottom face of a width no greater than the thickness of the film strip for compressingly retaining the margin of the segment. The body member including the undercut ledge and the retainer member including the complementary lips are each integrally molded of a resilient polymeric material. The sidewalls of the cavity in the body member and the edge faces are beveled at complementary angles so as to fit conformably but non-interferingly together when assembled with the segment.

The cavity and retainer member are preferably sized to a length and width that exceed the length and width, respectively, of the segment by a predetermined margin such that the retainer member can resiliently compress the margin of the segment when interlocked within the body member. The body member can have an opening sized to a rectangular length and width less than the length and width of the segment. The retainer member preferably includes a central window for exposing a central portion of an upper side of the segment of film strip opposite the opening. The window is sized to a length and width less than the length and width of the segment and greater than the length and width of the opening so that a marginal portion of the segment and beam leads are exposed and supported atop a marginal portion of the bottom wall. The window sidewall is beveled to make it easy for a test probe to be inserted at a downward angle against the supported marginal portion of the segment to contact the beam leads.

Preferably, each undercut ledge is defined by a portion of the sidewall of the cavity and a bottom of a core hole of predetermined depth, width and length extending through the body member from a bottom side thereof to form a corner at a first spacing from the bottom wall of the cavity. Correspondingly, each of the complementary lips is defined by a wedge-shaped protrusion from the exterior periphery of the retainer member having a beveled face inclined to form an obtuse angle with the bottom face of the retainer member and an acute angle corner at a second spacing from the bottom surface. The first and second spacings have a difference no greater than the thickness of the segment of flexible film.

The invention further provides a method for framing a TAB segment comprising the steps of positioning the body member in a loading station with the cavity exposed on one side and the body member supported on the opposite side. A TAB segment is inserted in the exposed cavity and the retainer member is inserted in the cavity over the TAB segment. Thereafter the body member and the retainer members are interlocked along opposed peripheries thereof.

Also provided by the invention is an apparatus for framing a TAB segment in a TAB carrier of the type having first and second carrier members which are engagable with one another for framing the TAB segment therebetween. The apparatus includes a row of stations comprising a TAB segment station, a first carrier member station and a second carrier member station. Means are provided for in-feeding a TAB segment, a first carrier member and a second carrier member in to the respective stations thereof. A carriage which is laterally shiftable over the stations includes pickup means mounted thereon. The pickup means is constructed and arranged to selectively pick up and release a TAB segment or carrier member contained in a station over which the pickup means is positioned.

Means are provided for coordinating carriage movement and operation of said in-feeding and pickup means to create a stack in one of said stations which includes a first carrier member laying on one side thereof, a TAB segment having one side thereof positioned on the upper side of said first carrier member, and a second carrier member having one side thereof facing the upper side of the first carrier member and with the TAB segment therebetween. The pickup means includes means mounted thereon for compressing a stack so created thereby engaging the carrier members with one another and framing the TAB segment therebetween.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 11 is a view taken along line 11 in FIG. 10.

FIG. 12 is a view taken along line 12 in FIG. 10.

DETAILED DESCRIPTION

General Arrangement

Figure 1:
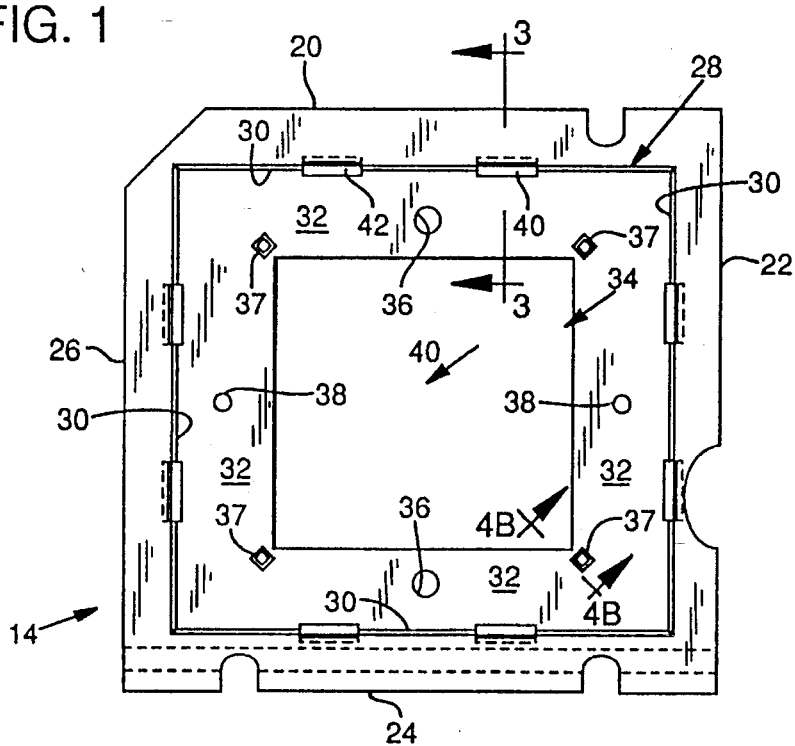
FIG. 1 is a top plan view of the body member of a carrier according to the invention.
Figure 5:
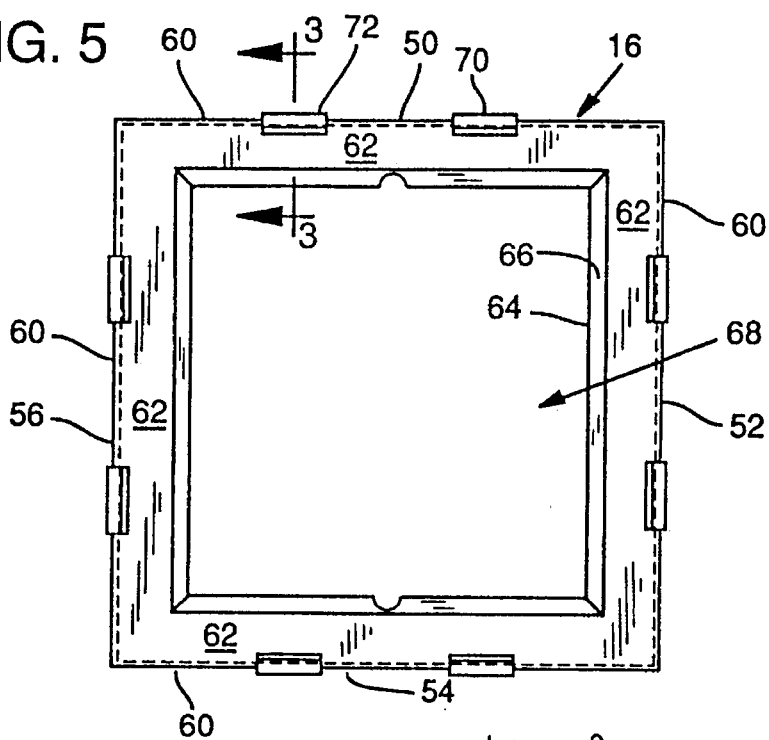
FIG. 5 is a top plan view of the retainer member employed in the carrier of the present invention, by insertion into the cavity of the body member of FIG. 1.
Figure 6:
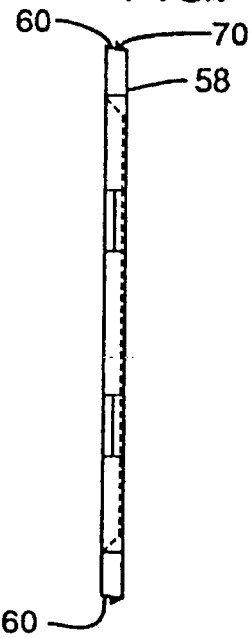
FIG. 6 is a side elevational view of the retainer member of FIG. 5, interior details being shown in dashed lines.
Figure 7:
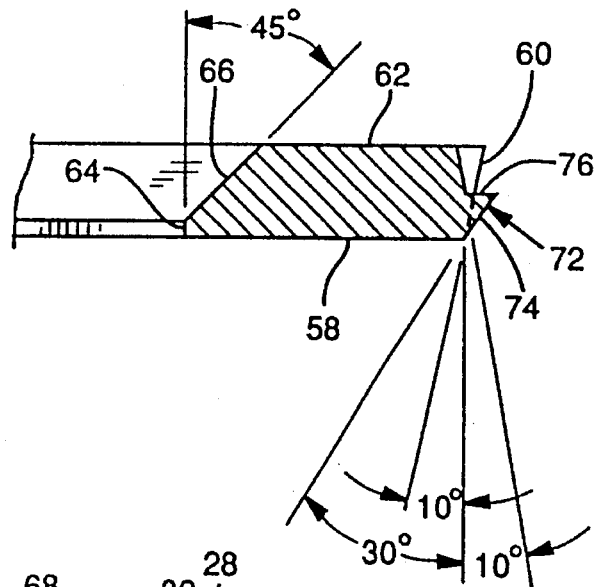
FIG. 7 is an enlarged cross-sectional view taken along lines A—A in FIG. 5.
Figure 8:
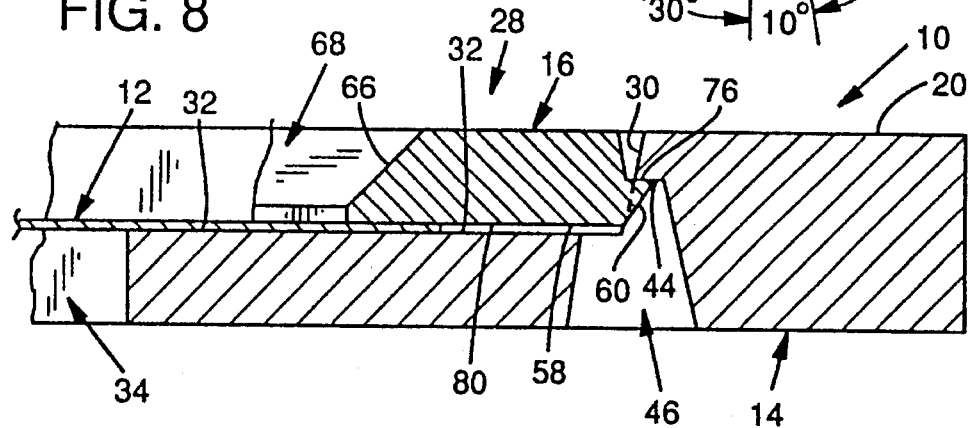
FIG. 8 is an enlarged cross-sectional view similar to FIGS. 3 and 7 showing the carrier of FIGS. 1 and 5 assembled with a segment of flexible film strip sandwiched between the body and retainer members.

Referring to FIGS. 1, 5 and 8, a carrier 10 for mounting a segment 12 of a flexible film strip or TAB tape includes a body member 14 (FIGS. 1–3) and a retainer member 16 (FIGS. 5–7).

Figure 4A:
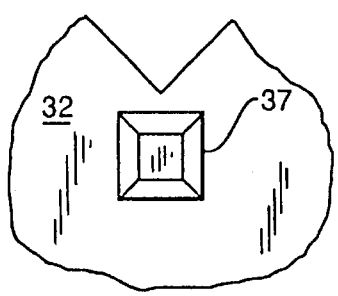
FIG. 4A and 4B are enlarged top plan view and side elevational view of the segment alignment lugs used in the body member of FIG. 1.
Figure 4B:
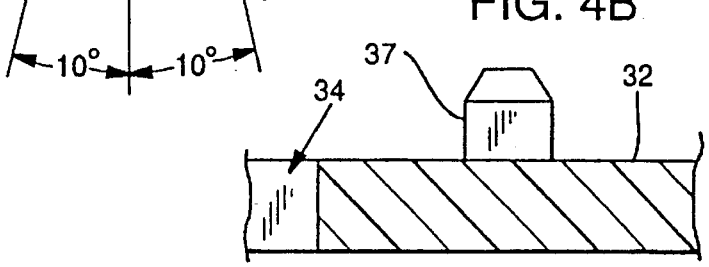

The general structure of segment 12 is disclosed, with an integrated circuit chip bonded to the beam leads thereof, in U.S. Pat. No. 4,069,496. The structure of the segment used in the preferred embodiment disclosed herein can be much more complex, however, with hundreds of beam leads. It is modified in accordance with JEDEC standards, to provide alignment pins in each corner of the beam lead metallization pattern, as will be made more clear in the following description of the alignment pins shown in FIGS. 4A and 4B.

A specific example of carrier 10 is shown in the drawing figures with dimensions in inches. This example is designed for use with a rectangular film segment 12 measuring 1.309" long by 1.376" wide and having a film thickness of 0.005–0.007". All of the foregoing dimensions are provided solely to disclose an operative example of a carrier embodying the present invention and are not intended to limit the scope of the invention. Those skilled in the art will readily perceive that the principles of the invention can be applied to film segments of different dimensions. The body member 14 is, additionally, based on the above-mentioned AMS carrier to provide compatibility with conventional handling equipment. Accordingly, the external dimensions and geometry of body member 14 are conventional and need not be further described.

The body member 14 and retainer member 16 are formed by injection molding of a static-resistant, glass and carbon-filled plastic or other suitable polymeric material. The preferred material is AKZO J-1300/30/CF/5/Natural. This material is used in the aforementioned carrier. Following, in Table 1, is a list of the properties of this material, of which the mechanical properties of flexural strength and modulus and ability to retain shape under stress and at high temperatures, are important to carrying out the present invention. Other polymeric materials are known which will also meet the requirements of the present invention.

TABLE 1

AKZO J-1300/30/CF/5/Natural
Exemplary Property Data

| Mechanical Properties | Units | ASTM Test | Values |
|---|---|---|---|
| Tensile Strength | psi | D638 | 208,400 |
| Elongation | % | D638 | 1.1 |
| Tensile Modulus | psi × $10^5$ | D638 | 22.6 |
| Flexural strength | psi | D790 | 27,100 |
| Flexural Modulus | psi × 105 | D790 | 21.3 |
| Izod Impact Strength ¼" | ft-lbs/in | D255 | 1.2 |
| Physical Properties | | | |
| Water Absorption in 24 hrs. | % | D570 | 0.20 |
| Linear Mold Shrinkage | | | |
| ¼" | in/in | — | .0001 |
| ⅛" | in/in | — | .0005 |
| Specific Gravity | — | D792 | 1.95 |
| Electral Properties | | | |
| surface Resistivity | ohm/sq | D257 | $2.7 \times 10^5$ |
| Thermal Properties | | | |
| Deflection Temperature | | | |
| Under Load @ 66 psi | °F | D648 | >500 |
| Under Load @ 264 psi | °F | D648 | >500 |

Body Member Configuration

Figure 2:
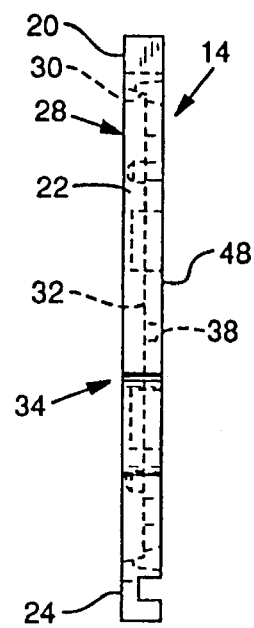
FIG. 2 is a side elevational view of the carrier of FIG. 1, interior detail being shown in dashed lines.
Figure 3:
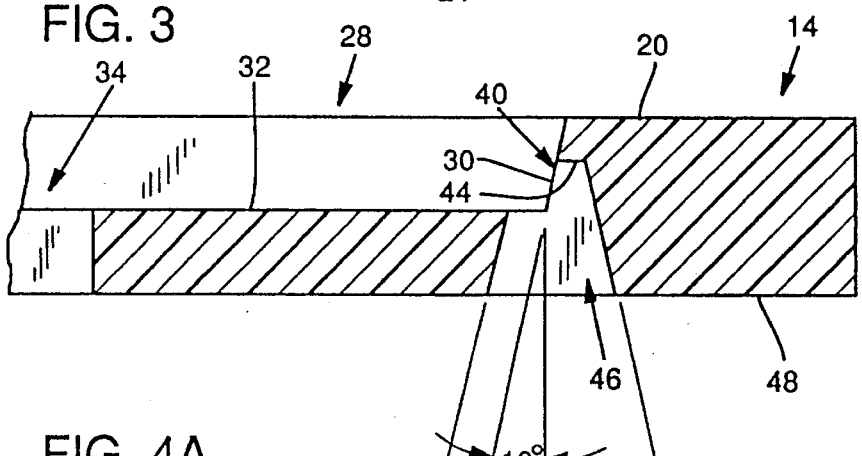
FIG. 3 is an enlarged cross-sectional view taken along lines A—A in FIG. 1.

Referring now to FIGS. 1, 2 and 3, the body member 14 comprises a first rectilinear frame formed by four side or frame members 20, 22, 24, 26. The body member has smooth, flat top and bottom surfaces. The external periphery of these side members include various cutouts, notches and grooves which are conventional and will not further described.

A rectangular cavity, indicated generally by reference numeral 28, is formed within the frame members 20–26. It has a rectangular interior periphery defined by sidewalls 30 on each of the frame members 20–26 and a flat bottom wall 32 integrally connected to each of the side members 20–26. A rectangular central opening 34, sized to expose a central portion of a lower side of the segment 12 of flexible film strip, is centered on the bottom wall 32. A pair of alignment holes 36 are conventionally formed in the bottom wall, centered along opposite side members 20, 24 for alignment with sprocket holes in the sides of the film strip segment. Four square alignment pins 37 are positioned at the corners of the opening, in accordance with JEDEC standards. These pins are detailed in FIGS. 4A and 4B.

A pair of extraction holes 38 are formed in the bottom wall along the axis of the carrier, that is, centered along the frame side members 22, 26. These holes are provided in accordance with the invention to aid in removal of the retainer member 16 and segment 12 after processing.

Sidewalls 30 are beveled at an angle of 10° from a normal to the plane of bottom wall 32. A series of undercut ledges are spaced along the interior periphery of the cavity of the body member and spaced depthwise from the bottom wall of the cavity in sidewalls 30. In the particular example of the carrier shown in the drawings, two such ledges 40, 42 are formed in the sidewall 20, 22, 24, 26 of each side frame member. Fewer or more such ledges and complementary lips (described below) can be used in smaller or larger carriers.

The structure of ledge 40, shown in FIG. 3, is typical of all of the ledge members. The ledge is formed by a bottom 44 of a core hole 46 that extends upward from the bottom side 48 of the body member toward the top side thereof along a normal to the plane of bottom wall 32. It is aligned such that the axis of the core hole intersects inclined wall 30 at the intersection of wall 30 and wall 32. Ledge 40 is thus formed with an 80° acute angle corner. The length of the core hole is elongated relative to its width, as shown in FIG. 1. The depth of the core hole bottom 44 is carefully set relative to the elevation of bottom wall 32 and the thickness of film segment 12 and retainer 16, as further described below.

Retainer Member Configuration

Referring to FIGS. 5–7, the retainer member 16 is similarly formed as a second rectilinear frame defined by side frame members 50, 52, 54, 56 arranged to provide a rectangular exterior periphery. The periphery of the retainer member is defined by outer edge faces 60 shaped and sized to fit conformably within the rectangular sidewalls 30 of the cavity 28. As shown in FIG. 7, the edge faces 60 are beveled at a 10° angle from a normal to the flat bottom face 58 of retainer member 16 so as to form a 100° obtuse angle between faces 58, 60. The retainer member has a flat bottom face 58 and a flat top face 62 positioned to align flushly with the top face of the body member.

Complementary to the undercut ledges in the sidewall of the body member, a series of lips are spaced along the exterior periphery of the retainer member. In the example of carrier shown in the drawings, two such lips 70, 72 are formed in each side 50, 52, 54, 56 of the retainer member. Lip 72 shown in FIG. 7 is typical of all the lips.

These lips are positioned along the sides of the retainer member so as to protrude from the outer edge faces in juxtaposition with the undercut ledges of the body member for engaging therewith to interlock the retainer member with the body member in nested relationship. In this relationship, shown in FIG. 8, a margin of the rectangular segment 12 is sandwiched between the flat bottom wall 32 and the flat bottom face 58, respectively, of the body and retainer members. The lips 70, 72 are spaced depthwise from the bottom of the cavity so as to provide a space 80 between the bottom wall and the bottom face of the retainer member having a width no greater than the thickness of the film strip for compressingly retaining the margin of the segment 12. The film strip typically has a thickness that ranges between a minimum and a maximum, for example 0.005–0.007 inch in the example shown, so the space 80 is sized to a width substantially equal to the minimum thickness.

Referring to FIG. 7, each lip 70, 72 defined by a wedge-shaped protrusion from it respective edge face 60, having a beveled face 74 inclined to form an obtuse angle of about 120° from a normal to bottom face 58. The wedge-shaped protrusion also has a top face 76 that is essentially parallel to bottom face 58. Thus, the face 74 and face 76 form the wedge-shaped protrusion at an angle of about 60°. When the retainer member is nested within the cavity of the bottom member, the complementary lips 70, 72 interlock beneath the ledges 40, 42 of the body member, face 76 of the lip engaging against bottom face 44 of the ledge.

As mentioned above, face 44 is spaced at a predetermined spacing from the bottom wall 32 of the body member. Similarly, face 76 is spaced at a predetermined second spacing from the bottom face of the retainer member. These two spacings are predetermined so as to have a difference no greater than the thickness of the segment of flexible film, preferably a thickness equal to the minimum dimension in the range of thickness of the film.

The retainer member top face 62 includes a interior sidewall 64, 66 defining a rectangular window 68 in the retainer member. The side frame members 50-56 are sized to a width such that the window is larger than opening 34 in the body member. Face 66 of the retainer member is beveled, or example, at a 45° angle (135° from the plane of strip 12). This arrangement provides a marginal area of the segment, upon which rectangular contact pads are formed, that is both supported from the underside by the bottom wall 32 and exposed on the upper side of the film segment for contact by test probes to test the beam leads and/or an integrated circuit bonded thereto.

The cavity is sized to a length and width that is larger than the length and width of the film segment 12 by a margin such that only the innermost approximately one-third of the retainer member contacts the top surface of segment 12. In other words, space 80 underlies a substantial portion of retainer member 16 outside of the perimeter of the film segment 12. This enables the retainer member to flex slightly to resiliently compress the margin of the film segment when interlocked within the body member. Additionally, the retainer member is dimensioned so that the length and width along the edge faces 60 match the length and width of cavity 28 along the sidewalls 30. Since the edge faces and sidewalls are beveled at an angle of 10° from the normal to the bottom wall 32 and bottom face 58, the thickness of the film segment 12 spaces the side and edge faces 60, 30 very slightly apart so that they non-interferingly inter-fit. This slight space allows the edges of the retainer body to flex downward to permit the lips to pass beneath the ledges when the retainer is inserted into the cavity. Once inserted, the retainer member fits conformably within the cavity but without frictional engagement of the edge faces 60 against the side faces 30 of the cavity. Consequently, the retainer member is resiliently interlocked in the body member solely by the inter-engagement of the ledges and complementary lips.

The retainer member is easily removed by placing the assembled carrier over a pair of vertical pins spaced apart and sized to align with extraction holes 38 in the body member 14. By lowering the assembled carrier or raising the pins, the ends of the pins protrude through holes 38 to contact the bottom face 58 of the retainer member equidistantly between the sets of inter-engagement means on opposite sides of the carrier. The retainer member can thereby be ejected from the cavity by forces applied equally to the pins, with the complementary lips disengaging uniformly from the ledges in the body member. The noninterference fit of the retainer member in the cavity avoids a frictional engagement of the two members that might otherwise laterally skew the forces needed to extract the retainer member.

Figure 9:
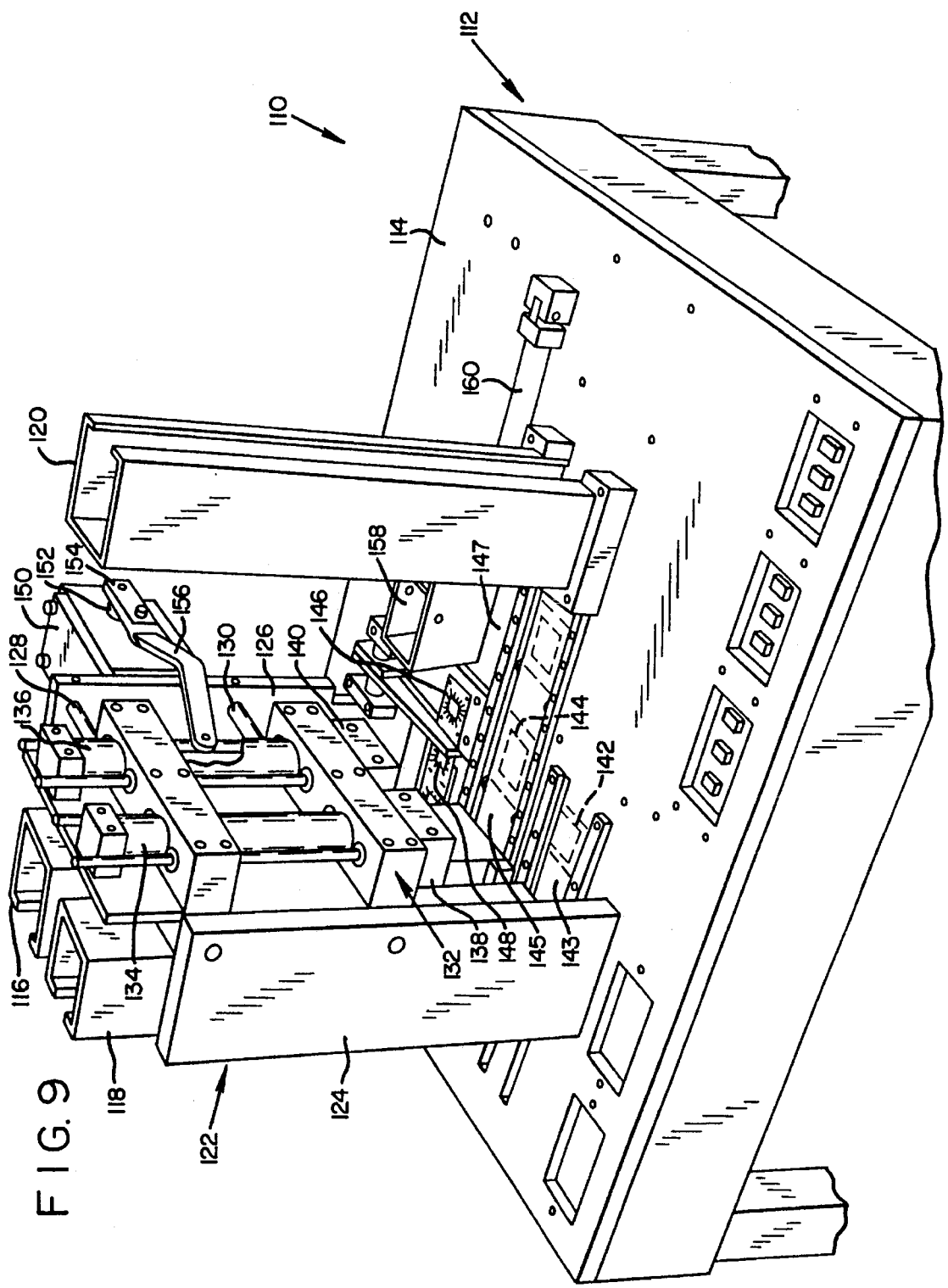
FIG. 9 is a perspective view of a fully automatic TAB framer constructed in accordance with the present invention.

Indicated generally at 110 in FIG. 9 is a TAB framer constructed in accordance with the present invention. Included therein is table 112 having a top 114 which supports structure both above and below the top. Such structure includes a bin 116 for holding a stack of body members, like the body member shown in FIG. 1; a bin 118 for holding a stack of retainer members, like the retainer member illustrated in FIG. 5; and a bin 120 for holding a stack of framed TAB segments, a portion of one such framed TAB segments being shown in FIG. 8. An upright frame 122 includes a pair of opposed upright end supports 124, 126 having a pair of substantially parallel guide rods 128, 130 supported therebetween. A carriage 132 is mounted on guide rods 128, 130 for sliding movement between end supports 124, 126.

Mounted on carriage 132 are is retainer pick pneumatic ram 134 and a film pick pneumatic ram 136. Each ram includes a pick up head 138, 140, respectively, mounted on a rod (visible in FIG. 14) which is downwardly extendable from each ram. Each pick up head is connected to a source of vacuum pressure (not visible) which enables it to pick up a body member, a retainer member or a TAB segment, under vacuum action, when the head is lowered over a member or TAB segment supported on table top 114.

Figure 10:
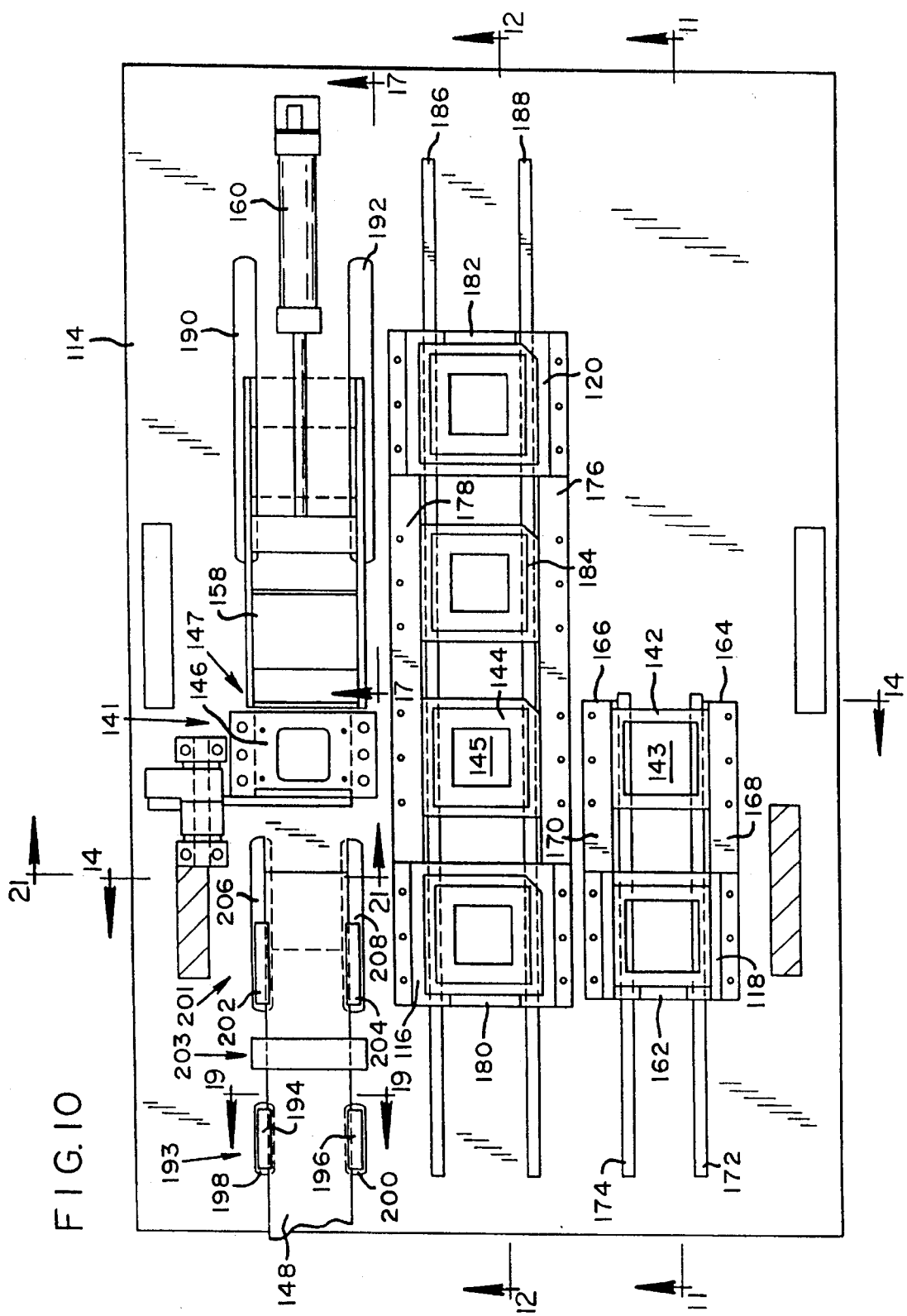
FIG. 10 is a top plan view of the TAB framer shown in FIG. 9.

Indicated generally at 141 in FIG. 10 is a film cutter assembly which will be described in more detail hereinafter.

A retainer member 142 (such being also referred to herein as a second TAB carrier member), a body member 144 (such being also referred to herein as a first TAB carrier member) and a TAB segment 146 are supported on a retainer member station 143, a loading station 145 and a cutting station 147, respectively, all formed on table top 114. Loading station 145 is also referred to herein as a first carrier member station and the cutting station is also referred to herein as a TAB segment station or as means for supporting a TAB segment while retainer member station 143 is also referred to herein as means for supporting a second TAB carrier member. Carriage 132 is illustrated in a first lateral position in FIG. 9. When the carriage is shifted to position pick up head 138 over loading station 145 and pick up head 140 over cutting station 147, carriage 132 is in what is referred to herein as a second lateral position.

Retainer member 142 is substantially identical to the retainer member shown in FIG. 5 and related figures. Body member 144 is substantially identical to the body member shown in FIG. 1 and related figures. TAB segment 146 comprises an integrated circuit chip bonded onto a segment of flexible film material on which an array of flexible, conductive beam leads have been formed. TAB segment 146 has been cut from a continuous strip of flexible film, a portion 148 of which is visible in FIG. 9., by film cutter assembly 141.

A pneumatic rotary actuator 150 is mounted on one side of end support 126 and includes a shaft 152 having a first arm 154 fixedly attached thereto at a 90° angle. A second arm 156 has one end pivotally attached to the outer arm of 154 and the other end pivotally attached to carriage 132. Arm 156 includes a dog-leg bend therein so that when actuator 150 turns shaft 152 180° counterclockwise, carriage 132 moves from the first lateral position (shown in FIG. 9) in which heads 138, 140 are over carrier members 142, 144 respectively, to the second lateral position in which heads 138, 140 are over carrier member 144 and TAB segment 146, respectively. Clockwise rotation 180° returns the carriage to the position shown in FIG. 9.

A hopper 158 is moveable, responsive to a pneumatic ram 160, between the position shown in FIG. 9 and a position in which hopper 158 is beneath pick up head 140 when carriage 132 is in its second lateral position. As will later be described in more detail, a TAB segment which has been picked up by head 140 can be dropped into hopper 158 (when ram 160 is extended) which is then moved by ram 160 to the position of FIG. 9. Only TAB segments which have been marked to indicate that the segment has failed testing are deposited in the hopper.

Prior to additional description of the structure of TAB framer 110, a general description of the manner in which the TAB carrier members and TAB segments are manipulated by framer 110 to produce a framed TAB segment will be provided. Generally speaking, carriage 132 laterally shifts between its first position, shown in FIG. 9, and its second position while rams 134, 136 raise and lower pick up heads 138, 140. The vacuum operated pick up heads selectively pick up and transfer TAB segments, like TAB segment 146, one at a time from cutting station 147 on to a body member, like body member 144, in loading station 145. Similarly, head 138 picks up and transfers retainer members, like retainer member 142, one at a time from retainer member station 143 to loading station 145 on top of the TAB segment. As head 138 lowers the retainer member, it compresses the retainer member into the body member with the TAB segment therebetween thereby engaging the body members and framing the TAB segment.

While so doing, head 140 is also lowered to cutting station 147 to pick up the next TAB segment which has been cut, in a manner in which will be herein after more fully described, from strip 148. Both heads lift with a TAB segment in head 140 and with head 138 empty and the carriage laterally shifts to the first position, as shown in FIG. 9. While such occurs, another body member moves from bin 116 onto loading station 145 and another retainer member moves from the lower end of bin 118 onto retainer member station 143. The mechanism for moving the members to their respective stations is described hereinafter. Heads 138, 140 lower while carriage 132 is in the first lateral position with head 140 depositing the TAB segment on the body member and head 138 picking up the retainer member. Thereafter lateral shifting of the carriage to the second position occurs with head 138 lowering again to engage the retainer member on head 138 with the body member in the loading station and head 140 lowering to pick up the next TAB segment. Framed TAB segments are shifted from loading station 145 into the lower end of bin 120.

Consideration will now be given in more detail to the structure of TAB framer 110.

Turning now to FIG. 10, bin 118 includes therein a stack 162 of retainer members, each of which is substantially identical to retainer member 142. Bin 118 is mounted on a pair of opposed substantially parallel rails 164, 166. Retainer member 142 rests on top of and between the rails so that it may be slid therealong or lifted therefrom. The lower-most retainer member in stack 162 likewise rests on rails 164, 166. That portion of bin 118 which spans rails 164, 166 is supported by the outer-most portions 168, 170 of rails 164, 166. Thus, the lower-most retainer member in stack 162 is slidable from the bottom of the stack toward retainer member 142. A pair of parallel slots 172, 174 are formed in top 114 and are spaced inwardly and substantially parallel to rails 164,166.

Rails 176, 178 are substantially identical to rails 164, 166, except longer, and have bins 116, 120 mounted on opposing ends thereof. A stack 180 of body members, like body member 144, is visible in bin 116. In the same fashion that retainer members are slidable along rails 164,166 from the lower end of bin 118, body members are slidable along rails 176, 178 from the lower end of bin 116. As will be later described in more detail, an assembled carrier with a TAB segment therein, such as that shown in FIG. 8, can be slid into the lower end of bin 120 along rails 176, 178 when the bin is empty. A carrier 184 substantially identical to the one in FIG. 8 is shown supported on rails 176, 178 between bins 116, 120. Means are provided for raising a stack 182 of framed TAB segments in bin 120 to facilitate sliding an additional framed TAB segment, like carrier 184, into the lower portion of the bin on rails 176, 178.

A pair of parallel slots 186, 188 are formed in table top 114 spaced inwardly from rails 176, 178 and substantially parallel thereto.

A pair of slots 190, 192 are provided to enable portions of hopper 158 to extend beneath table top 114. As will later be seen in more detail, those portions of hopper 158 which extend through slots 190, 192 engage parallel guide rails to facilitate hopper movement parallel to slots 190, 192.

A stationary film clamp indicated generally at 193 includes clamp sections 194, 196 which extend through slots 198, 200, respectively, in table top 114. A moveable clamp indicated generally at 201 includes clamp sections 202, 204 which extend through slots 206, 208, respectively, in the table top. As will later be described in more detail, clamp sections 202, 204 clamp the edges of film strip 148 and advance the same by moving to the right in slots 206, 208. After the film is so moved, clamp sections 194, 196 clamp strip 148 to stabilize the film strip while a single TAB segment is cut therefrom by cutting assembly 141. When such occurs, clamp sections 202, 204 release the strip and return to the position shown in FIG. 10. The cycle is thereafter repeated.

A film sensor housing 203 contains a sensor which monitors film passing therebeneath to sense whether a film segment having a semiconductor die and associated leads has been marked to indicate a defective component. Such sensing and the response of the TAB framer thereto is discussed in more detail hereinafter.

Turning now to FIG. 11, a retainer-member advance bar 214 is received in slot 172. Advance bar 214 includes horizontal substantially planar edges 215, 217 and a vertical edge 219. Advance bar 214 and associated structure are also viewable in FIG. 14. Advance bar 214 is mounted on a spacer block 218 as is a second retainer member advance bar 216. Advance bar 216 extends through slot 174 in the same fashion that bar 214 extends through slot 172 and is substantially identical to bar 214. In the view of. FIG. 11, bar 216 is directly behind bar 214. Block 218 maintains advance bars 214, 216 in opposed parallel spaced relation to one another. A pair of rods 220, 222 are rigidly mounted on block 218 in parallel spaced relation to one another. The lower end of rods 220, 222 are mounted on a block 224 which includes a roller 226 journaled thereon.

Rods 220, 222 extend through bores, as shown, in a guide block 228 and are axially slidable relative to block 228. The guide block is horizontally slidable along a pair of guide rods 230, 232. The guide rods have opposing ends thereof mounted on blocks 234, 236 which in turn are fixedly mounted on the underside of table top 114. Guide block 228 is thus horizontally slidable along guide rods 230, 232 while rods 220, 222 and associated blocks 218, 224 and advance bars 214, 216 are vertically moveable as a unit relative to guide block 228. A spring 233 is received in opposing bores formed in spacer block 218 and guide block 228 as viewed in FIG. 14. Rods 220, 222 together with blocks 218, 224 are collectively referred to as an advance bar carrier 221.

The ends of advance bars 214, 218 opposite advance bar carrier 221 are connected to an advance bar carrier 238 which is substantially identical to carrier 221. A guide block 240 (also visible in FIG. 16) is laterally slidable on guide rods 230, 232 in the same fashion as guide block 228. A roller 241 is mounted on advance bar carrier 238 in the same manner that roller 226 is mounted on carrier 224. A commercially available pneumatic ram 242 has one end pivotally attached to guide block 240 and the other end pivotally attached to a retainer-member advance bar cam 244. Cam 244 includes lower cam surfaces 246, 248 which ride on rollers 226, 241, respectively, when the cam bar and advance bar carriers 221, 238 are in the configuration shown in FIG. 11. Cam bar 244 further includes lower edges 250, 251 which are substantially planar and which form the lowermost surface of the cam bar.

A dog-leg bar 252 is pivotally connected at one end thereof to guide block 240 and is pivotally connected at the other end thereof to a crankshaft 254. A pneumatic rotary actuator 256 drives the crankshaft in a manner which will be hereinafter described.

Turning now to FIG. 12, a body-member advance bar 258 extends through slot 188. Advance bar 258 includes upwardly-directed substantially planar surfaces 260, 262, 264, 266, 268. Advance bar 258 further includes substantially vertical planar surfaces 270, 272, 274. A second advance bar 276 (viewable in FIG. 14) extends through slot 186 and is maintained in parallel spaced relation to bar 258 by a spacer block, in FIG. 14, in the same manner that spacer block 218 maintains advance bars 214, 216. A body member 271, such being substantially identical to the body member shown in FIG. 5 is supported on surface 262 and on the corresponding upwardly directed surface on advance bar 276 when the advance bars are positioned as shown in FIG. 12.

A pair of body-member advance bar carriers 278, 280 support advance bars 258, 276 in the same manner carriers 221, 238 support advance bars 214, 216. Each carrier includes a guide block 282, 284 and a roller 286, 288. Each of guide blocks 282, 284 are mounted on a pair of guide rails for horizontal movement with each of carriers 278, 280 permitting vertical movement of advance bars 258, 276 in the same manner as described in connection with the structure in FIG. 11.

A ram 290 has one end pivotally connected to guide block 284 and the other end pivotally connected to a body-member advance bar cam 292. Cam 292 includes a pair of downwardly directed cam surfaces 294, 296 and a pair of downwardly directed substantially planar surfaces 298, 300 which define the lower-most edge of the cam bar.

A dog-leg bar 302 has one end pivotally connected to guide block 284 and the other end pivotally connected to crankshaft 254. Crankshaft 254 includes bar mounting arms 304 to which bar 302 is connected. When TAB framer 110 is in operative condition, actuator 256 moves crankshaft 254 between a first position, illustrated in solid lines in FIG. 12, and a second position, illustrated in dash lines in FIG. 12 and in solid lines in FIG. 13.

Figure 13:
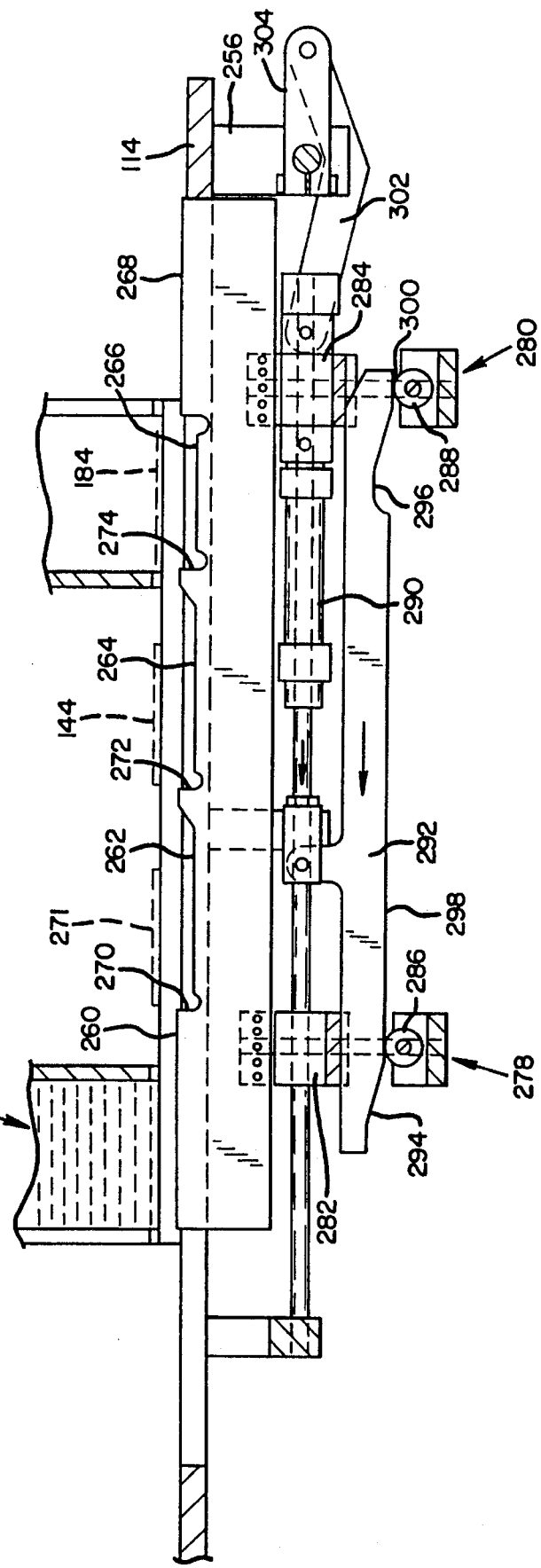
FIG. 13 is a view similar to FIG. 12 with the structure shown in a different configuration.
Figure 15:
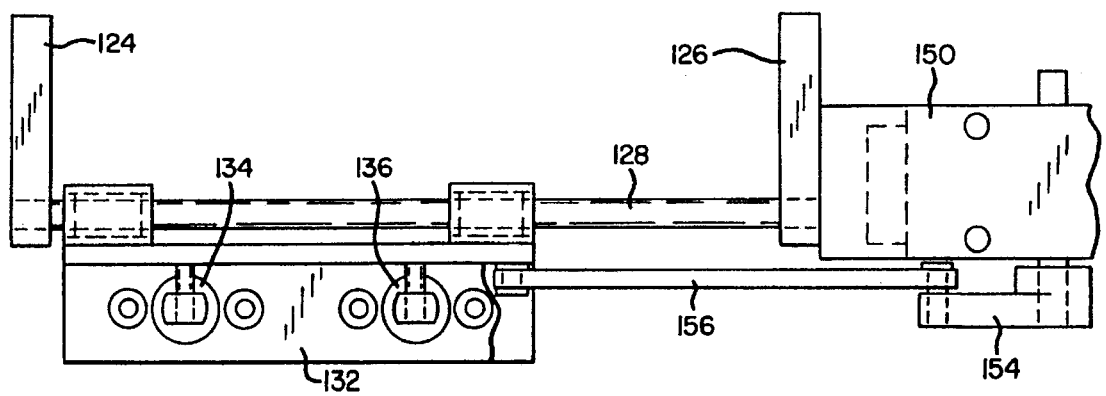
FIG. 15 is a top plan view of the structure shown in FIG. 14.

In addition to crankshaft 254 being in its second position in the view of FIG. 13, ram 290 is shown in its extended position, as opposed to the contracted position thereof illustrated in FIG. 12.

Generally speaking, advance bars 258, 276 operate to draw a single body member from the lower end of stack 180 in bin 116 and to move it to the position of body member 144 in FIG. 12. Substantially simultaneously with such movement, the body member (which is assembled with a TAB segment and retainer member) in loading station 145 is moved to the position of carrier 184 in FIG. 12 while the carrier in the position of carrier 184 is pulled beneath the lower end of stack 182 in bin 120.

The foregoing is accomplished when crankshaft 254 moves from its first position, shown in FIG. 12, to its second position, shown in FIG. 13. When such movement occurs, member 271 is drawn off the lower end of stack 180 in bin 116 under the action of surface 270 on the left-most side of member 271 in FIG. 12. Similarly, surface 272 urges member 144 to the right while surface 274 urges carrier 184 to the right. Surface 268 and the corresponding upwardly directed surface on advance bar 276 support the lower end of stack 182 and allow carrier 184 to be moved into bin 120 beneath stack 182 as the advance bar is moved to the right.

When advance bars 258, 276 are in the right-most position, shown in FIG. 13, ram 290 extends thereby moving cam bar 292 forward relative carriers 278, 280 and causing rollers 286, 288 to ride on surfaces 298, 300. Carriers 278, 280 and advance bars 258, 276 attached thereto are therefore moved downwardly to the position shown in FIG. 13. Next, actuator 256 returns to its first position as shown in FIG. 12 with the upper most surfaces of advance bars 258, 276 being held beneath the lower most surfaces of the body members resting on rails 176, 178.

When the advance bars are in the left-most position, illustrated in FIG. 12, ram 290 returns to its contracted position thereby causing rollers 286, 288 to ride back onto cam surfaces 294, 296 so that the advance bars assume the configuration shown in FIG. 12. In the configuration of FIG. 12, the advance bars are again positioned to urge body members, via surfaces 270, 272, 274 resting on rails 176, 178 to the right in response to actuator 256 driving crankshaft 254 to its second position. Further detail concerning the operation of the present embodiment of the invention will be provided hereinafter.

Figure 14:
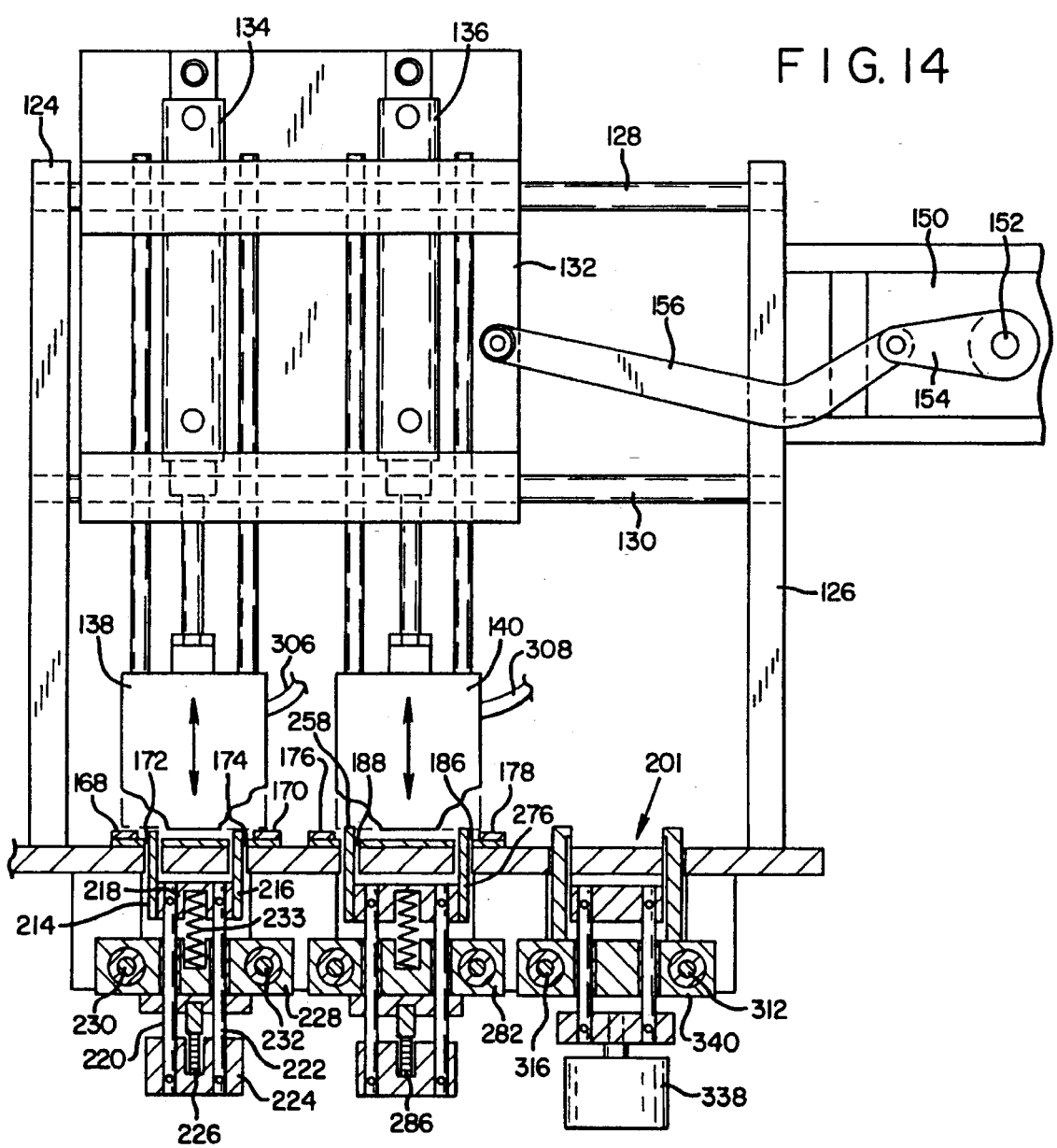
FIG. 14 is a view taken along line 14 in FIGS. 10, 11, 12 and 16.

Turning now to FIG. 14, pick up heads 138, 140 are shown in a lowered position, i.e., with rams 134, 136 extended, while in the view of FIG. 9, the pick up heads were shown in an upper position, i.e., with the rams contracted. Each pick up head includes a pair of guide rods fixedly attached thereto which are slidable within bores formed through portions of carriage 132 to stabilize the heads and guide them as they are raised and lowered. Each head includes a plurality of bores (not visible) on the lower surface thereof which are connected to a source of vacuum pressure (not shown) via vacuum hoses 306, 308. As will later become more fully apparent in connection with the description of the operation of the TAB framer, head 138 is operable to move from an upper position, shown in FIG. 9, to a lower position, shown in FIG. 14, to pick up (under vacuum action) a retainer member positioned on rails 168, 170 beneath the head. Thereafter head 138 is raised, lifting the retainer member therewith and carriage 132 is shifted to the right on rails 128, 130. Head 138 is thereafter lowered and the retainer member held thereby is engaged with a body member resting on rails 176, 178 by continued lowering of the pick up head. When a TAB segment is received in the body member, a framed TAB segment is produced.

Similarly, head 140 is operable to pick up a TAB segment from cutting station 148 when the carriage is shifted to the right as viewed in FIG. 14. Such a TAB segment is lifted by head 140 to the upper-most position of the head, carriage 132 is shifted to the left and thereafter the TAB segment is lowered into a body member resting on rails 176, 178 in loading station 145 beneath head 140. More detailed description of the operation of pick up heads 138, 140 is provided hereinafter.

Figure 16:
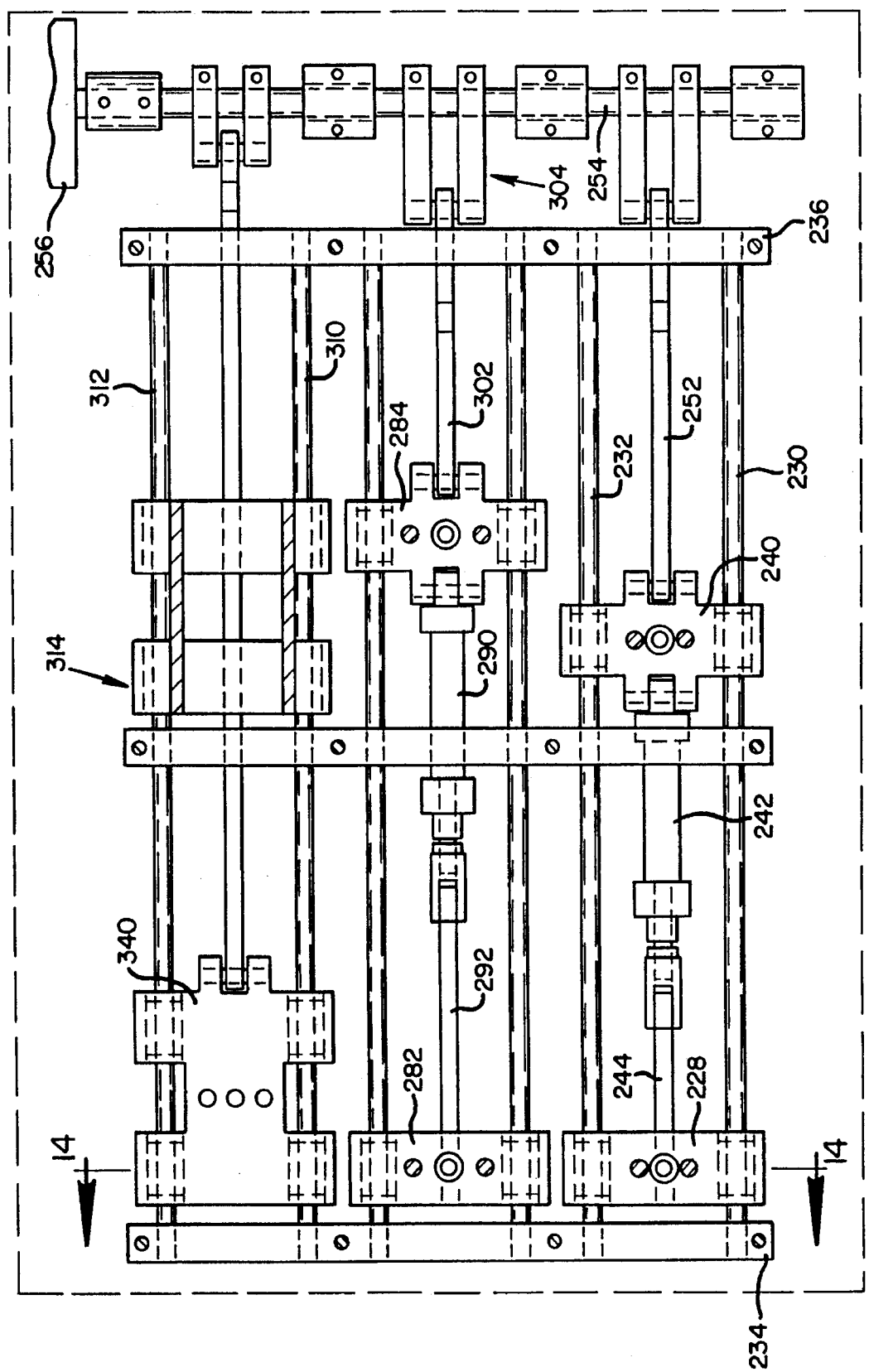
FIG. 16 is a view taken along line 16 in FIGS. 11 and 12.
Figure 17:
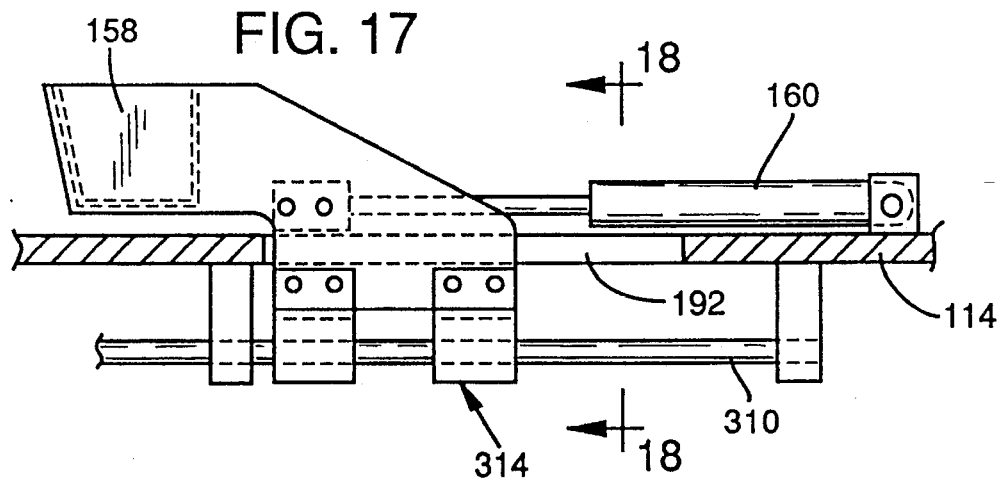
FIG. 17 is a view taken along line 17 in FIG. 10.
Figure 18:
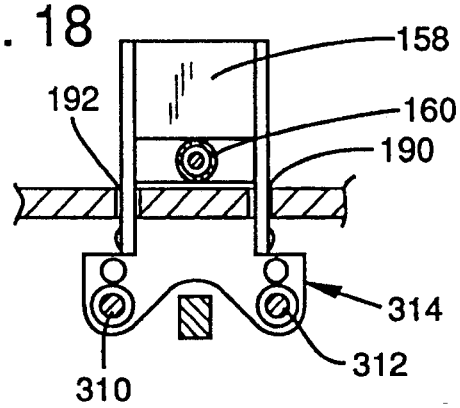
FIG. 18 is a view taken along line 18 in FIG. 17.

Turning attention now to FIGS. 17 and 18, hopper 158 is slidably mounted on guide rails 310, 312 (viewable in FIG. 16). A hopper carriage 314 is connected to the lower portion of the hopper through slots 190, 192 with the carriage being slidably engaged with guide rails 310, 312 to facilitate hopper movement between a position in which ram 160 is extended, shown in FIG. 17, and one in which the ram is contracted (shown in FIG. 10). With hopper 158 in its extended position, the hopper is positioned over cutting station 147 and, as will later be described in more detail, can receive a TAB segment picked up and held by head 140 when vacuum pressure is removed from hose 308 and with carriage 132 shifted to the right as viewed in FIG. 14.

Figure 19:
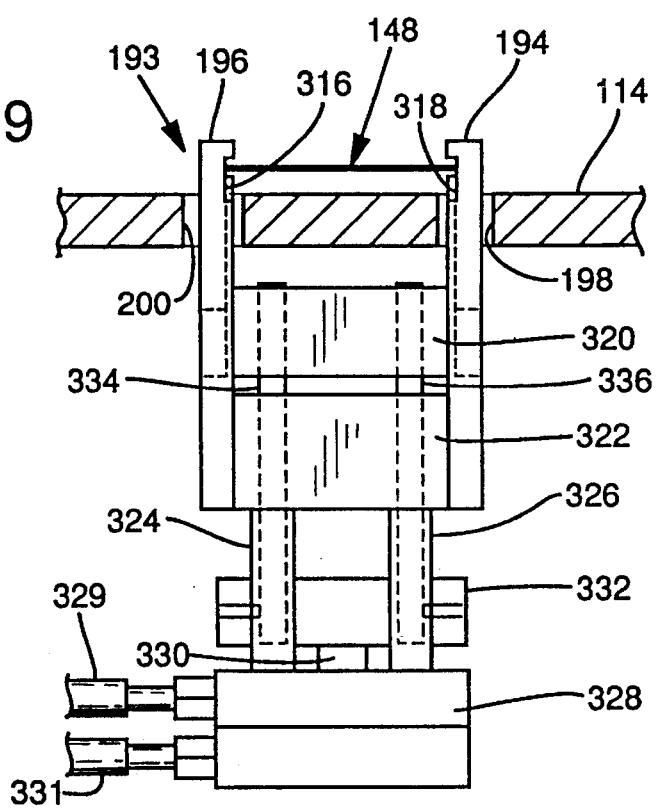
FIG. 19 is an enlarged sectional view taken along line 19 in FIG. 10.

Turning now to FIG. 19, stationary film clamp 193 includes therein a pair of opposing substantially planar clamping jaws 316, 318. Each of the clamping jaws is fixed to a jaw carrier block 320. The jaws are mounted on opposing ends of the block with each jaw having one side thereof flush against the inner side of its associated jaw section, like jaw 316 is against jaw section 196.

A clamp mounting block 322 is secured to each of clamp sections 194, 196. Block 322 is mounted on the side of block 234 (in FIG. 16) opposite guide rods 310, 312 thus fixing stationary film clamp 193 relative to table 112. Four ram mount spacers two of which are spacers 324, 326 are each cylindrical in shape and have one end fixed to the lower end of block 322 and the other end fixed to an upper surface of a pneumatic clamp ram 328. The other two spacers are directly behind spacers 324, 326 in the view of FIG. 19 and are thus not visible. A ram rod 330 is extensible and retractable from the upper side of ram 328. A push rod support member 322 is mounted on the upper end of rod 330 and has attached thereto a pair of elongate push rods 334, 336. Each of the push rods is positioned between a pair of ram mount spacers. The other ends of the push rods are fixedly attached to jaw carrier block 320. It can thus be seen that when ram 328 is actuated, via air pressure in one of hoses 329, 331, to extend rod 330 upwardly, block 320 is urged upwardly by push rods 334, 336. As block 320 moves upwardly so do clamping jaws 316, 318 thus clamping film 148 between the upper edges of the clamping jaws and a lower surface on each of clamp sections 194, 196. Such clamping restrains film 148 against lateral movement. Film 148 is unclamped by providing pneumatic pressure in the other of hoses 329, 331 thereby contracting rod 330 downwardly and thus lowering clamping jaws 316, 318 and freeing the film.

Turning attention once again to FIG. 14, moveable clamp 201 is constructed in substantially the same manner as stationary clamp 193 and includes therein a ram 338 for clamping and unclamping the jaws in moveable clamp 201 in the same fashion as ram 328 clamps and unclamps jaws 316, 318 in the stationary clamp. Moveable clamp 201 is mounted on a guide block 340, also visible in FIG. 16. Guide block 340 is slidable along guide rods 312, 316 responsive to rotation of shaft 254 in the same fashion that such rotation moves guide blocks 228, 282.

Looking now at FIGS. 20 and 21, further consideration will be given to structure of film cutter assembly 141. A rectangular, substantially planar bed knife 342 is mounted on table top 114. A bed knife includes four index bores 344, 346, 348, 350, which, as will later be described in more detail, receive index pins on pick up head 140 when the same lowers onto bed knife 342. A recessed area 352 is formed on the upper surface of bed knife 342 to accommodate a chip mounted on the underside of film 148, although in the present embodiment the chips are mounted on the upper side of film 148. A carbide insert 354 is mounted on the edge of bed knife 342 towards which film 148 approaches. A carbide knife 356 is pivotally mounted on a shaft 358 which in turn is journaled in clamps 360, 362 for rotation about the longitudinal axis thereof. Knife 356 is mounted on shaft 358 via mounting blocks 364, 366. Block 366 is rigidly connected to a knife lever 368. A film cutter ram 370 has one end thereof pivotally connected to lever 368 and the other end thereof pivotally connected to table 112. It can thus be seen that extension of the ram causes counter-clockwise (as viewed in FIG. 21) rotation of shaft 358 and thus raises knife 356 to a position in which film 148 is moveable over bed knife 342. Thereafter, contraction of ram 370 pivots the knife into the position shown in the drawings and cuts the film along the juncture of carbide insert 354 and knife 356.

A film lift ram 372 has the upper end thereof mounted on the underside of table top 114. The ram is of a size which permits guide block 340, upon which movable film clamp 201 is mounted, to just clear the underside of the ram as the guide block slides on rods 310, 312. Ram 372 includes a rod 374 which is extensible from the upper end of thereof. The upper end of rod 374 is connected to a film lift block 376 which is received in a recess formed in table top 114. Rod 374 extends through a bore in the table top into the recess.

After a piece of film is cut from strip 148 by knife 356 as described above, the knife is raised. In order to advance film over carbide insert 354, ram 372 is actuated to extend rod 374 thus raising film lift block 376 and the end of strip 148 received thereover. The film is raised just enough so that when strip 148 is advanced over bed knife 342 the forward edge of strip 148 clears carbide insert 354. In the event that film 148 includes semiconductor chips mounted on the underside thereof the lift provided by ram 372 is sufficient to permit the chips on the underside of the film to pass over carbide insert 354. In the present embodiment of the invention, which does not include chips on the underside of film strip 148, the film lift ram raises film 148 approximately $\frac{1}{16}$".

Figure 22:
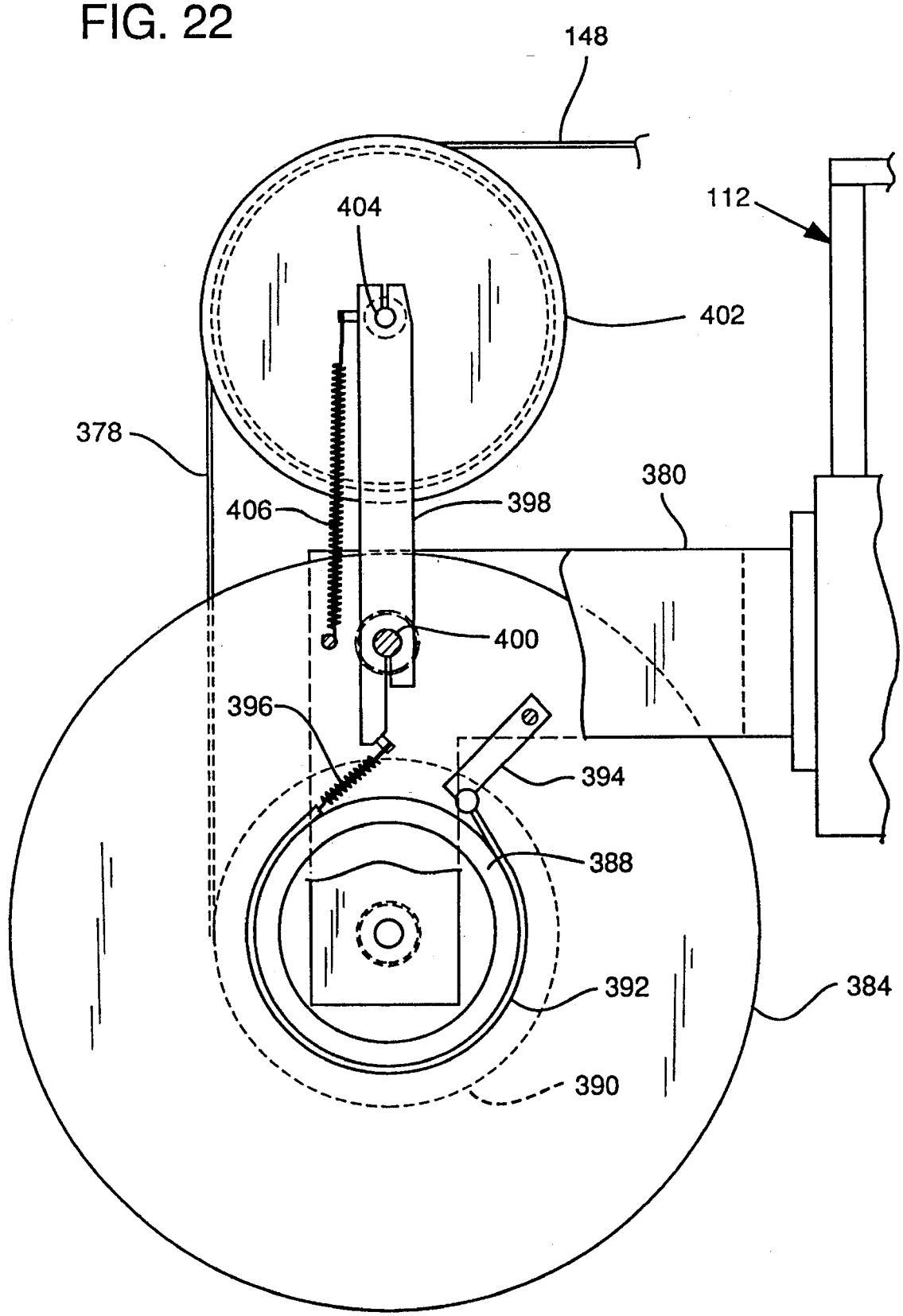
FIG. 22 is an enlarged side elevation view of a tape supply assembly incorporated in the preferred embodiment.
Figure 23:
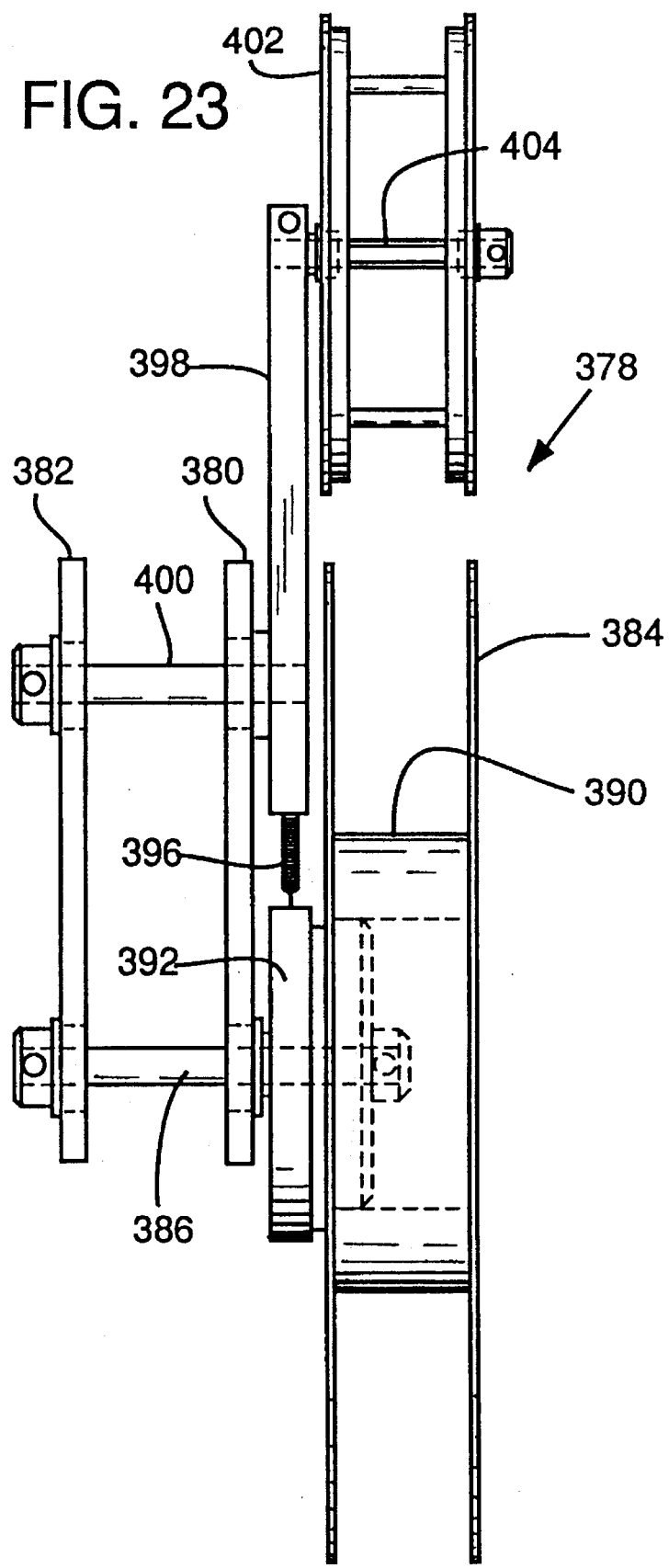
FIG. 23 is a front elevation view of the tape supply assembly of FIG. 22.

Turning now to FIGS. 22 and 23, indicated generally at 378 is a film supply assembly. The film supply assembly is mounted on the left side, with reference to FIG. 10, of table 112 so as to feed film strip 148 onto the table. Assembly 378 is mounted on a pair of spaced apart right-angle brackets 380, 382 which are mounted on and extend from table 112. The film supply reel 384 is mounted on a shaft 386 for rotation about the axis thereof. A cylindrical brake drum 388 is mounted on an outer side of reel 384 coaxial therewith. Film 148 is wound onto reel 384 to form a roll 390 of film from which strip 148 unwinds. A brake band 392 has one end anchored on a bracket 394, which is fixed to bracket 380, and the other end connected to one end of a spring 396. The other end of spring 396 is fixedly connected to the lower end of a tension arm 398.

Tension arm 398 is pivotally mounted on bracket 380 for rotation about the axis of a shaft 400. The upper end of the tension arm includes a tension wheel 402 over which film 148 winds. The tension wheel is mounted for rotation about the axis of a shaft 404 on the upper end of the tension arm. Spring 406 has one end thereof connected to the tension arm adjacent shaft 404 and the other end thereof connected to bracket 380.

It can thus be seen that pulling on the portion of film 148 wound over tension wheel 402 pivots tension arm 398 clockwise (in FIG. 22) thus introducing slack in brake band 392 and permitting supply wheel 384 to unwind film from roll 390. When tension on strip 148 is reduced to the point that spring 406 biases tension arm 398 back to the position shown in the drawings, brake band 392 is again biased, by spring 396, into contact with brake drum 388 thus stopping rotation of the supply wheel. Film supply assembly 378 thus provides a means for permitting small rapid advances of strip 148.

Figure 24:
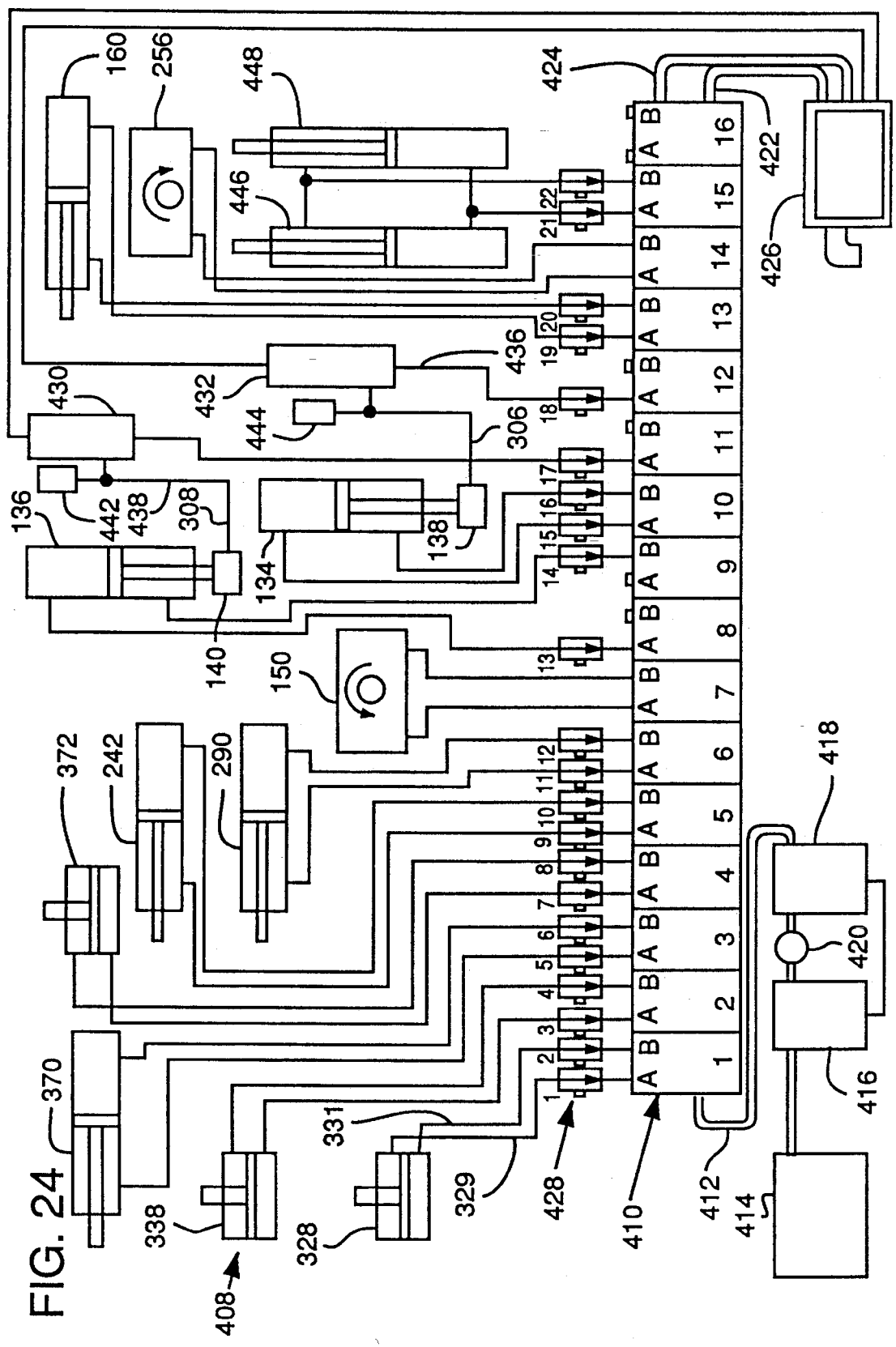
FIG. 24 is a schematic of the pneumatic system of the preferred embodiment of the present invention.

Turning attention now to FIG. 24, indicated generally at 408 is a schematic depiction of the pneumatic system of the preferred embodiment of the present invention. Structure which is schematically illustrated herein and which has been previously referred to with an identifying number is identified with the same number herein. A valve bank 410 includes sixteen (16) commercially available four-way valves, each having a port A and a port B. Each of the valves is supplied with a source of pressurized air via conduit 412. An air compressor 414, air filters 416, 418 and a regulator 420, all of which are located beneath table 112, provide the pressurized air to conduit 412. A pair of exhaust conduits 422, 424 exhaust air to a leg 426 of table 112 which in turn is vented to the atmosphere.

Each of the valves in bank 410 includes an electromagnetic coil for switching the valve to a second condition when the coil is energized. In the un-energized condition, each of the valves connects port A to the exhaust manifold and port B to conduit 412. When the coil is energized, the position of ports A, B switch, i.e., port A is connected to conduit 412 and port B is connected to the exhaust manifold.

A bank 428 of flow control devices includes a plurality of commercially available flow control devices each of which are connected in-line with certain of the conduits which connect pneumatic devices to different ones of the valves in valve bank 410. Each flow control device is of the type which restricts flow in the direction of the arrow shown on each device by a preselected amount while permitting completely unrestricted flow in the opposite direction. As can be seen, the flow control devices are connected to restrict air exhausted from each side of rams in response to pressurized air being supplied to the other side. Each flow control device permits the flow of unrestricted pressurized air to its associated ram.

Included in the pneumatic system are a pair of commercially available vacuum generators 430, 432. When pressurized air is applied to each of the vacuum generators via conduits 434, 436 a vacuum is generated in conduits 438, 440 which are connected to ports in vacuum generators 430, 432, respectively. Conduits 438, 440 are connected to pick ups 140, 138, respectively, and generate the vacuum force which picks up TAB segment 146 (in FIG. 9) and retainer member 142 (also in FIG. 9), respectively, on the lower end of the pick up heads. Each vacuum switch 442, 444 is connected to conduits 438, 440, respectively, and generates an output signal based on the pressure in the conduit to which it is connected. The switches can thus be used to sense the presence or absence of a TAB segment or retainer member on the lower end of the pick up because of the pressure drop in the conduit when the bores which communicate vacuum pressure to the lower side of the pick up head are partially or completely blocked.

Finishing now the description of the structure in FIG. 24, a pair of rams 446, 448 are connected to one of the valves in bank 410 for jointly extending and contracting the rams responsive to valve actuation. Rams 446, 448 are mounted on the underside of table 112 and serve to raise table top 114 to permit access to components under the table top for service and maintenance.

Figure 25A:
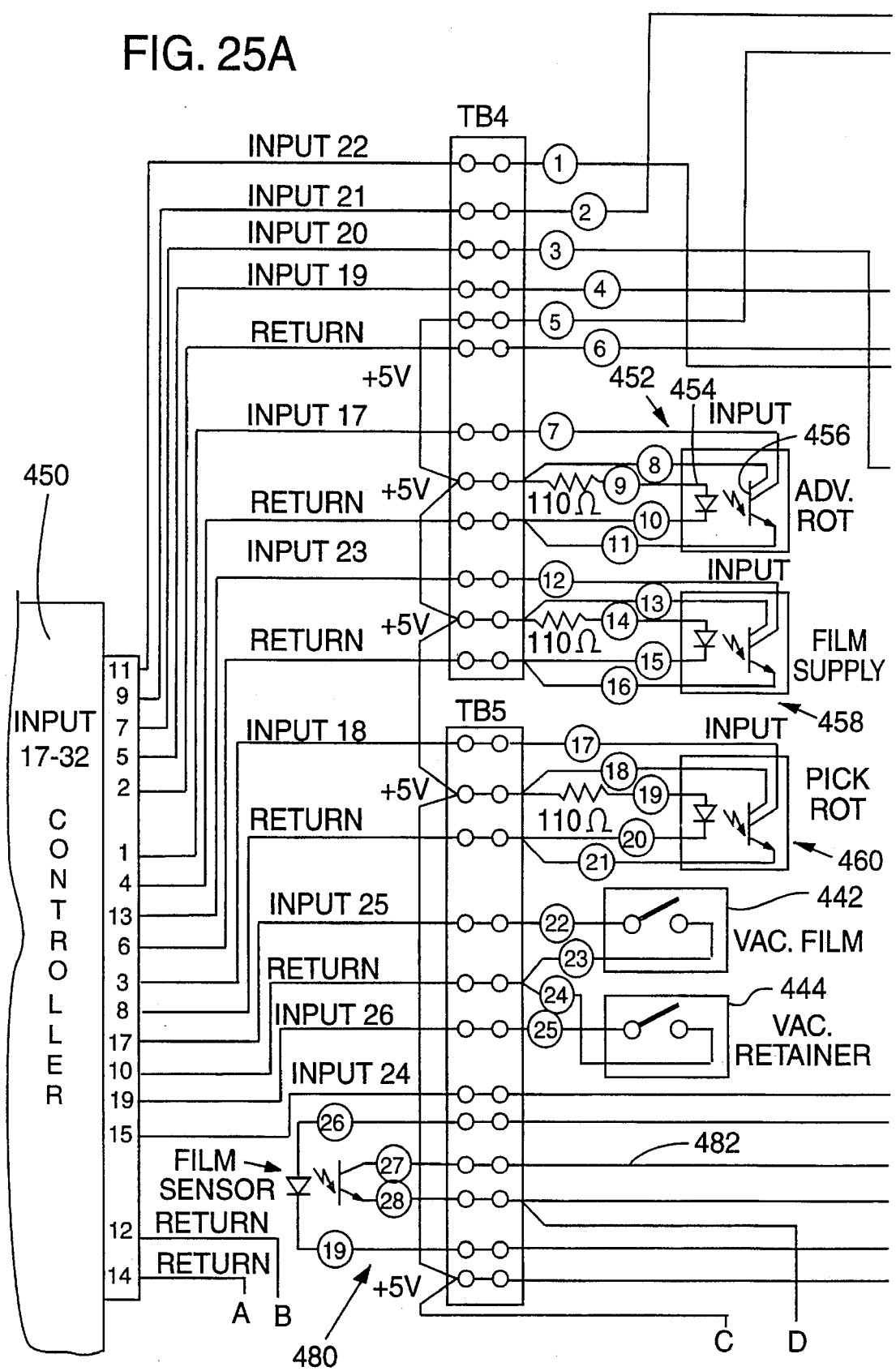
FIGS. 25A, B, C and D are electrical schematics of the preferred embodiment of the present invention.

Turning attention now to FIGS. 25A, B, C and D, consideration will be given to the electrical system incorporated in the preferred embodiment of the present invention. A microprocessor 450 receives inputs from a variety of sources, as will later hereinafter be explained, and generates outputs for controlling the operation of the preferred embodiment of the invention, primarily through activating and deactivating the valves in bank 410 in FIG. 24. The structure which has been previously identified herein retains the same identifying numeral in the schematic of FIGS. 25A, B, C and D. Indicated generally at 452 is a position sensor for rotary actuator 256. Position sensor 452 includes a light emitting diode (LED) 454 and a light sensing semiconductor devices 456. A disk (not shown) is mounted on the shaft of rotary actuator 256 and extends radially outward therefrom. LED 454 and device 456 are positioned on opposite sides of the disc. A pair of holes in the disc permit light from the LED to strike device 456 only when the shaft of the rotary actuator is in two preselected positions, namely the position shown in FIG. 12 and the position shown in FIG. 13. Signals generated by device 456 when struck by the light from the LED are communicated to microprocessor 450.

A film supply position sensor 458 is substantially identical to sensor 452 except that it is mounted on shaft 400 in FIGS. 22 and 23, although not shown other than schematically in FIG. 25A. Position sensor 458 generates a signal when tension arm 398 deviates substantially from its vertical orientation as shown in the drawings. Thus if film 148 completely unwinds from film roll 388, spring 406 biases the tension arm to its most counterclockwise position. If the end of film 148 wound around supply reel 384 is taped thereto, when all of film roll 390 is unwound from the supply wheel the film urges tension wheel 402 to its most clockwise position. Such occurrences are detected by sensor 458 which provides signals generated by the light sensing semiconductor device to microprocessor 450 thereby providing the microprocessor tension wheel position information.

A position sensor 460 for rotary actuator 150 is interrelated with rotary actuator 150 in the same manner that sensor 452 is interrelated with actuator 256 thus providing position information for actuator 150 to the microprocessor. It can also be seen that vacuum switches 442, 444 are connected to the microprocessor and thus provide information concerning whether or not a TAB segment or retainer member is positioned on the underside of either of pick up heads 138, 140.

Position sensors 452, 458, 460 and vacuum switches 442, 444 continuously signal the microprocessor concerning the sensed position and vacuum information. As will be seen, the devices on TAB framer 110 periodically cycle during normal operation. If the microprocessor detects a deviation from normal operation, the operator is alerted and/or operation of the TAB framer is automatically stopped.

Figure 25B:
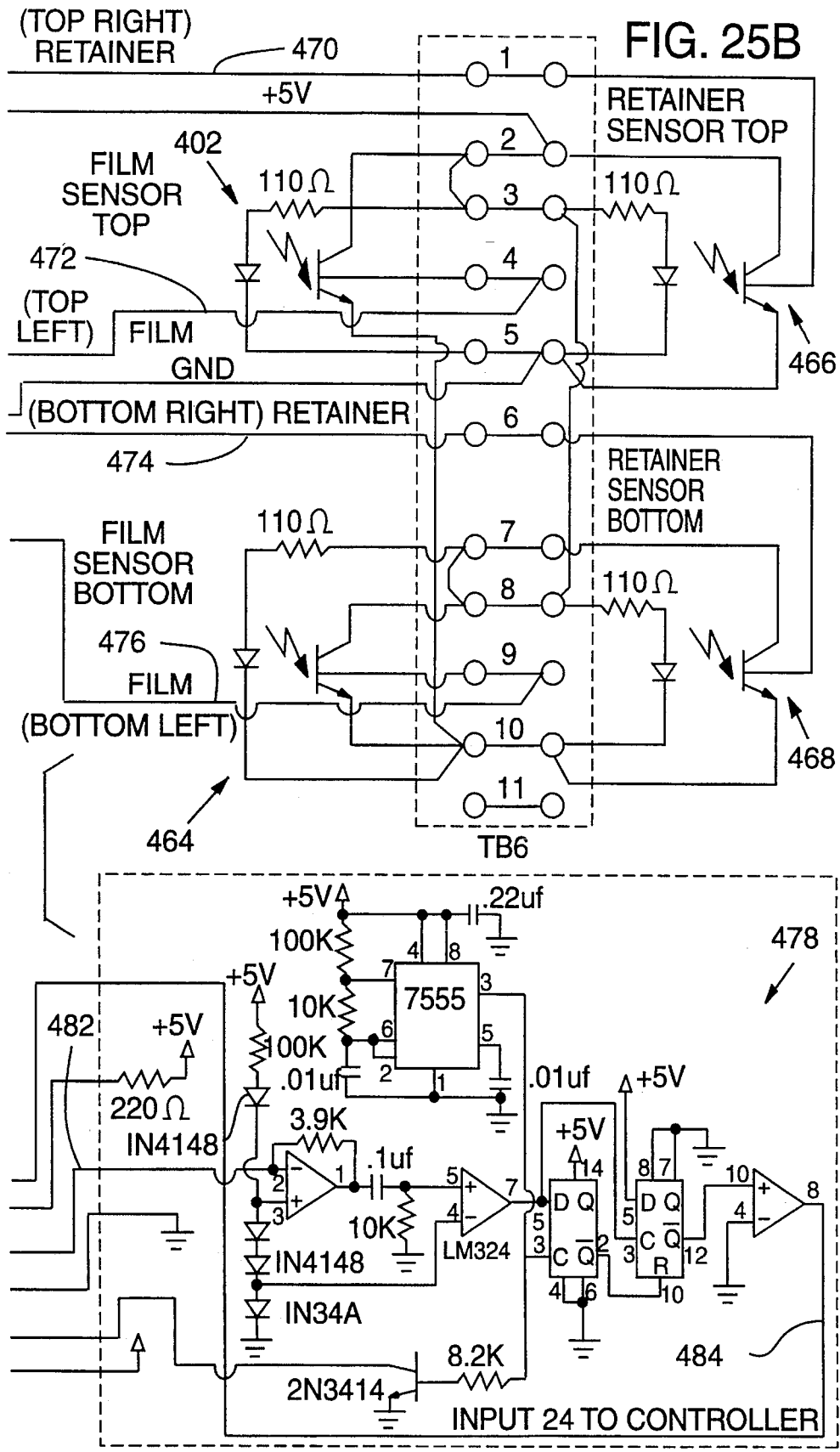
Figure 25C:
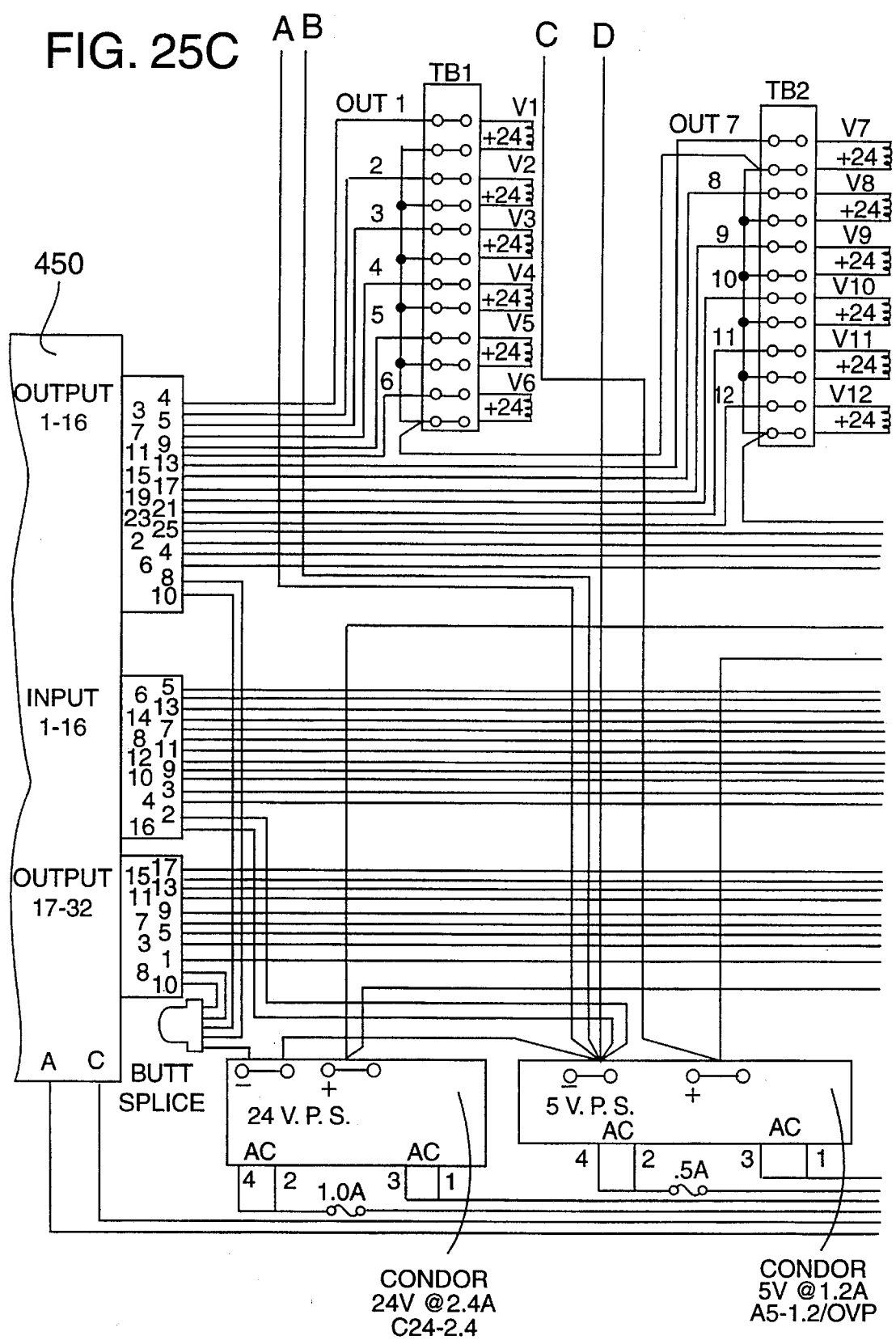

In FIG. 25B, indicated generally at 462 is a top position sensor for ram 136, at 464 is a bottom position sensor for ram 136, at 466 is a top position sensor for ram 138 and at 468 is a bottom position sensor for ram 138. Each of the position sensors in FIG. 25B are constructed similarly to those described in FIG. 25A. The FIG. 25B position sensors generate signals for the microprocessor which are transmitted thereto via conductors 470, 472, 474, 476 and which indicate whether or not rams 136, 138 are in their top most positions, their bottom most positions or somewhere in between.

Indicated generally at 478 is a film sensor circuit. A film sensor, indicated generally at 480 in FIG. 25A, is contained in film sensor housing 203 in FIG. 10. Film sensor 480 includes an LED and a light sensitive semiconductor device, as in each of the position sensors. An output of the film sensor is applied to a conductor 482 which in turn is applied to the input of circuit 478. Circuit 478 is conventional and may be built by a person having ordinary skill in the art. It functions to condition the signal generated on conductor 482 by sensor 480 to make it suitable as digital input to microprocessor 450. The output of circuit 478 is applied via conductor 484 to one of the microprocessor inputs.

Film sensor 480 detects reflections of light (generated by the LED in the film sensor) from the surface of film 148 as it passes beneath housing 203 in FIG. 10. As previously described, prior to mounting the film on the supply reel 384, the film is processed in a conventional manner to bond semiconductor dies and a conductive lead pattern which is interconnected with each die, to the film. Thereafter the film is tested to confirm the connections of the leads to the die and the operability of the die. When a particular die and lead pattern fail the test, the die is cut from the film by punching a hole therethrough. Reflected light is not detected by sensor 480 when a portion of the film having a hole therethrough passes through the housing 203. This condition is communicated to the microprocessor via circuit 478. As will hereinafter be more fully described, the microprocessor generates a set of commands for controlling the system when a punched out die is detected. Such commands will be discussed more fully hereinafter.

Figure 25D:
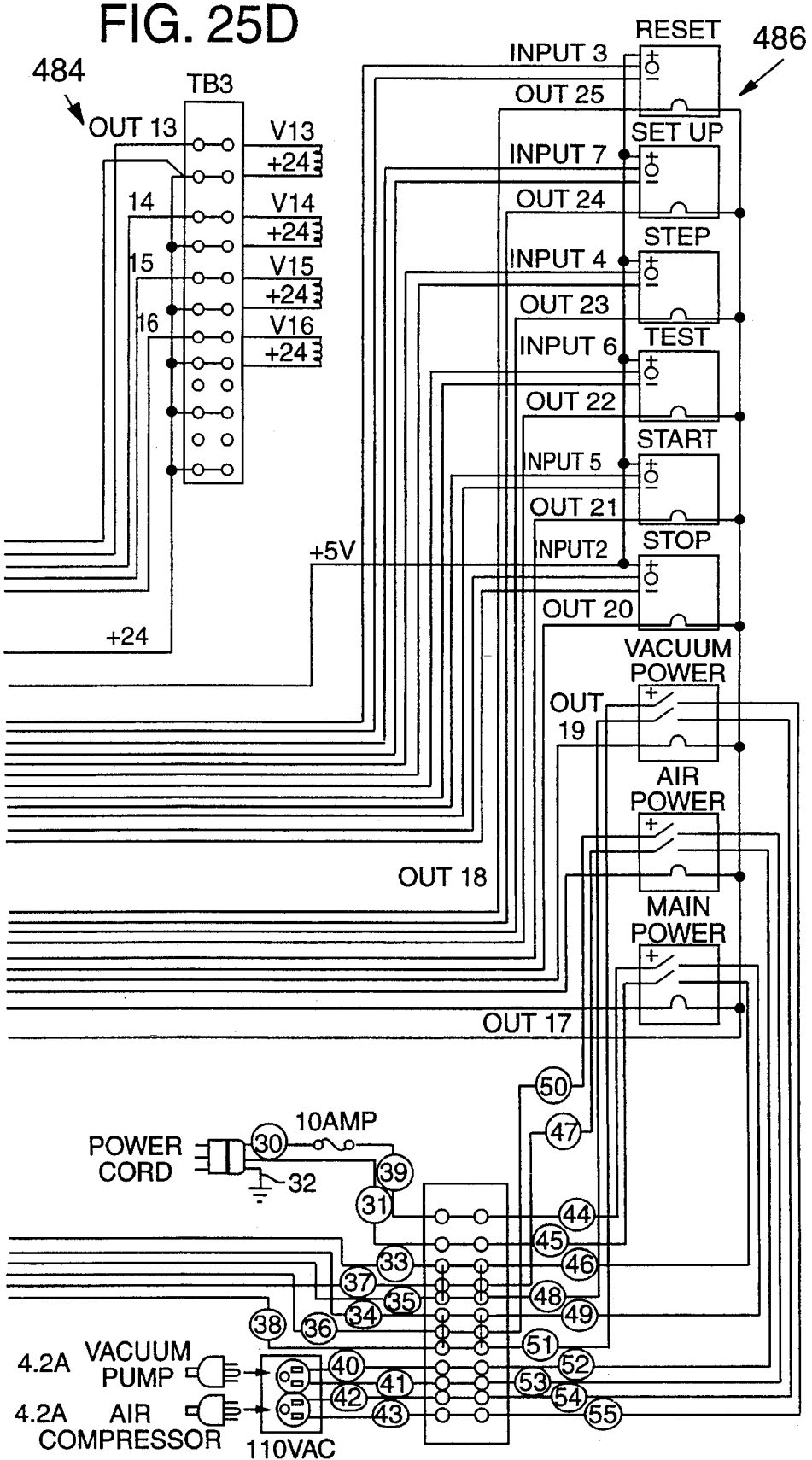

Turning now to FIG. 25D, indicated generally at 484 are sixteen (16) coils, each of which is connected to a different output of microprocessor 450 and each of which is a part of a different valve in valve bank 410 in FIG. 24. Voltage is applied across selected coils in response to a program resident in a memory (not shown) connected to microprocessor 450. When a valve coil is so energized, the valve is switched to its second or actuated position.

A plurality of switches 486 are labeled as to function and are operator-actuated to effect changes in the configuration of the TAB framer in a manner which will be hereinafter described. Each of switches 486 is connected to microprocessor 450 for providing inputs thereto.

Operation

Consideration will now be given to the operation of TAB framer 110. The operation of the TAB framer can be broken down into several cycles each of which consists of several discreet control operations effected by the microprocessor. The first cycle considered is the film pick cycle illustrated in the following Table 2.

TABLE 2

FILM PICK CYCLE

1. Film lift ram 372 down
2. Film pick ram 136 down
3. open stationary film clamps 193
4. Close movable film clamp 201
5. Vacuum generator 430 on
6. Film cutter ram 370 extended to cut film 148
7. Film pick ram 136 home
8. Film cutter ram 370 contracted to raise knife 356
9. Film lift ram 372 up
10. Test bad film flag
   A. If good: Count up counter in controller number 1 cycle complete
   B. If bad:  1. move hopper 158 under head 140 and release film count up counter number 2
             2. Move hopper 158 home
             3. Advance film
             4. Close stationary clamp 193
             5. Open movable clamp 201
             6. Retry film pick cycle Considering now the steps in sequence of the film pick cycle in Table 2, first, the valve connected to ram 328 (in FIG. 24) is de-energized responsive to microprocessor control thereby providing pressurized air to lower the ram and thus film lift block 376. Next, film pick ram 136 is lowered responsive to actuation of both valves in valve bank 410 to which ram 136 is connected thereby lowering pick up head 140 onto bed knife 354.

Figure 20:
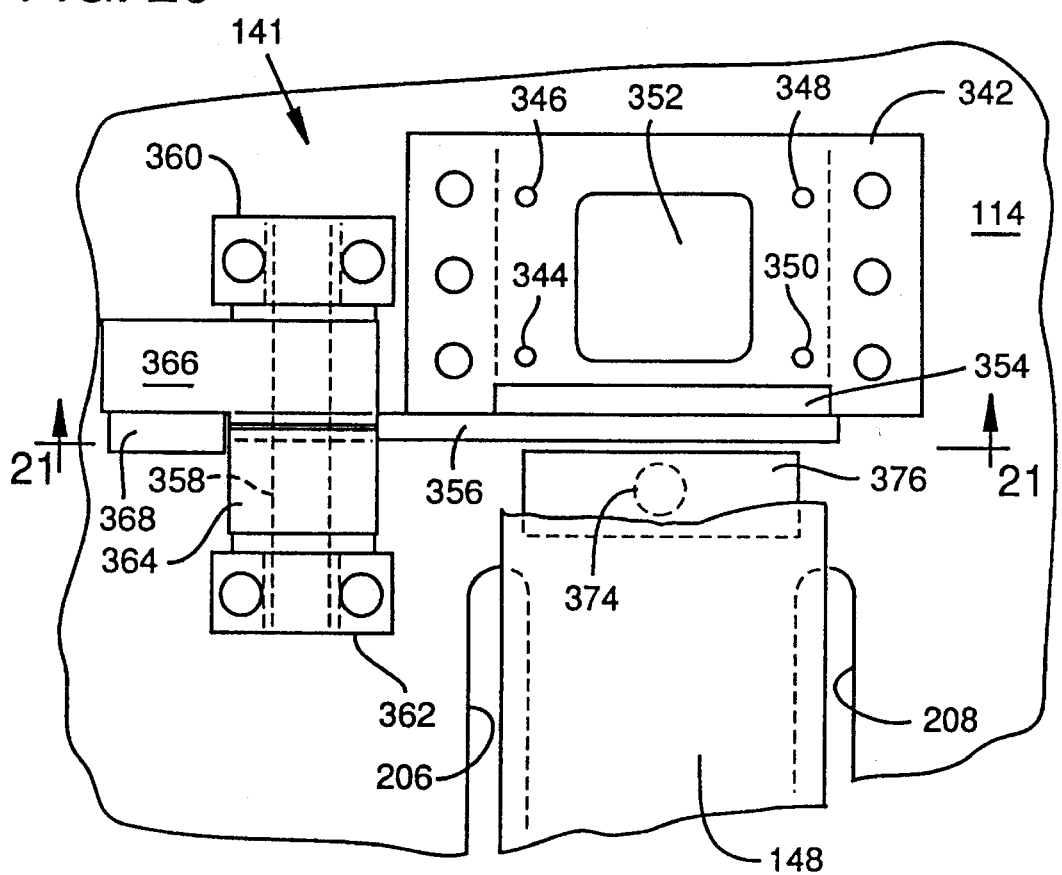
FIG. 20 is an enlarged plan view of the film cutter assembly shown in FIG. 10.
Figure 21:
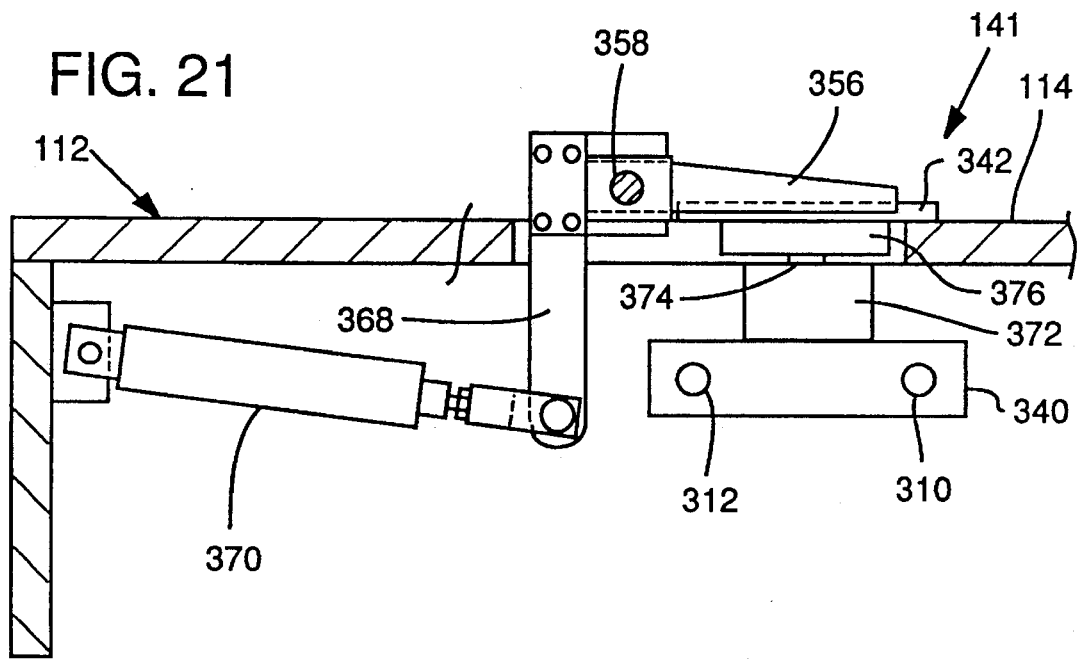
FIG. 21 is a slightly reduced view taken along line 21 in FIGS. 10 and 20.

Pick up head 140 includes four (4) tapered posts on the lower end thereof, each of which aligns with one of bores 344, 346, 348, 350 in FIG. 20 on bed knife 354. As will be later described sprockets in film 148 are substantially aligned with the bores in the bed knife as well as with corresponding tapered pins on head 140. Film 148 is advanced very slightly beyond the point of alignment of the film sprocket with bores 344–350, in the range of 1/1000" in the preferred embodiment. This provides a slight amount of excess film between stationary film clamp 193, which is closed, and the film cutting station so that the film is not stretched when the tapered pins on the underside of the pick up head pass through the film sprockets into the bores in the bed knife. Thus, the lateral position of the film is indexed exactly in each film pick cycle.

Next in the film pick cycle, film clamp 193 is opened by actuation of the valve to which ram 328 is connected thereby driving the ram to its lower most position. The moveable film clamp is closed responsive to actuation of its associated valve thereby extending ram 338. Actuation of the valve to which vacuum generator 430 is connected generates a vacuum pick up force at the lower end of pick up head 140. Next, film 148 is cut by contracting ram 370 thereby bringing the knife to the position in FIG. 21 and cutting film 148. The valves connected to ram 136 are then deactivated thus causing ram 136 to move to its contracted position thereby raising pick up head 140 with a TAB segment held to the underside thereof by vacuum action. Ram 370 is thereafter extended thus raising the knife to its home position. Film lift ram 372 is next raised by energizing the valve associated therewith.

When a bad TAB segment in film 148 is detected in the sensor in housing 203 (in FIG. 10) a flag is stored in the microprocessor memory which indicates when the bad segment is cut in cutting station 147 and thereafter picked up by pick up head 140. If the flag indicates a good TAB segment a register in the microprocessor is incremented and film pick cycle is complete. If the flag indicates a bad TAB segment, ram 160 is extended by actuation of the valve associated therewith thus moving hopper 158 beneath pick up head 140. Thereafter the valve connected to vacuum generator 430 is deactivated thereby removing vacuum from the pick up head and causing the bad TAB segment to drop in hopper 158. A separate register in microprocessor 450 is incremented thereby maintaining a count of the bad TAB segments. Next, hopper 158 is retracted from beneath the pick up head responsive to contraction of ram 160.

With stationary film clamps 193 opened and moveable film clamp 201 closed, film 148 is advanced. Such occurs responsive to actuation of the valve connected to rotary actuator 256 thereby cycling shaft 254 from the position shown in FIG. 12 to that shown in FIG. 13. Such movement of the shaft of rotary actuator 256 draws guide block 340, upon which moveable film clamp 210 is mounted, to the right as viewed in FIG. 16 thereby advancing the film over bed knife 348.

As will be recalled, such movement of the shaft of rotary actuator 256 normally draws a retainer member from the bottom of the retainer member bin and a body member from the bottom of the body member bin and positions each in the position of retainer member 142 and body member 144 in FIG. 9. However, when a bad segment is discarded in the hopper as described, the microprocessor is programmed to extend rams 242, 290 (in FIGS. 11, 12 and 24) thereby preventing advance bars 214, 258 from withdrawing retainer and body members from the lower end of each bin.

The film pick cycle is complete when stationary clamp 193 closes and moveable clamp 201 opens. Thereafter, the film pick cycle restarts at step one.

It is to be appreciated that a person having ordinary skill in the art of computer programing could write a computer program which causes microprocessor 450 to sequence the valves in valve bank 410 so as to sequence the TAB framer as set forth in Table 2 and in each of the following tables.

A retainer pick cycle is set forth in the following Table 3.

TABLE 3

RETAINER PICK CYCLE

1. Retainer pick ram 134 down
2. Vacuum generator 432 on
3. Retainer pick ram 134 home Retainer pick ram 134 is driven to its lower position by actuation of the valve (in FIG. 24) to which it is connected. Vacuum on pick up head 138 is initiated by actuation of the valve connected to vacuum generator 432. Lastly, retainer pick ram 134 is moved to its upper or contracted position when the coil in the valve to which the ram is connected is de-energized.

The following Tables 3 and 4 set forth the steps in the film place cycle and the retainer place cycle and involve energizing and de-energizing the coils in the valves associated with rams 134, 136 as previously described and de-energizing the valve associated with the vacuum generator for the pick up head located on the lower end of each ram.

TABLE 4

FILM PLACE CYCLE

1. Film pick ram 136 down
2. Vacuum generator 430 off
3. Film pick ram 136 home

TABLE 5

RETAINER PLACE CYCLE

1. Retainer pick ram 134 down
2. Vacuum generator 432 off
3. Retainer pick ram 134 home Illustrated in Table 6 is a film load cycle which sets up the TAB framer with a reel of film for automated operation.

TABLE 6

FILM LOAD CYCLE

1. Operator pushes load (set up) button
2. Open stationary clamp 193
3. Remove air from bottom of film pick ram 136
4. Operator positions film over bed knife 342
5. Operator pushes film pick ram 136 down to engage index pins with film 148 and bed knife bores

TABLE 6-continued

FILM LOAD CYCLE

6. Operator pushes load (set up) button
7. Close stationary clamp 193
8. Sense position of film pick ram 136
   A. If down: Force down and then home
   B. If home: Force home
   C. If neither: Alert operator to
      correct and push load button again
      to retry step 5

To initiate the load cycle, an operator pushes the set up button in FIG. 25D which is connected to microprocessor 450 and which signals the microprocessor to initiate the load cycle. Stationary clamp 193 opens responsive to a signal energizing the valve connected to stationary clamp ram 328 thus causing jaws 316, 318 (in FIG. 19) to lower under control of the ram and freeing film 148 for lateral motion. Air is removed from the lower portion of film pick ram 136 by energizing the valve connected to the lower portion of the ram. Thus, portions of ram 136 on either side of the piston are connected to the exhaust manifold and the rod with pick up 140 mounted thereon may be moved manually by the operator. The operator then threads film 148 through the stationary and moveable film clamps, both of which are open, and lays the end of the film over bed knife 342, pivotal knife 356 being in its home or raised position. The operator then manually pushes film pick ram 136 down to engage the tapered index pins on the lower end of head 140 with corresponding sprockets in the film and with bores 344, 346, 348, 350 in the bed knife. The operator again pushes the set up button in FIG. 25D, the second signal therefrom to the microprocessor causing stationary clamps 193 to close under action of its associated valve and ram. The microprocessor then senses the position of the film pick ram via sensors 462, 464 (in FIG. 25B) which provides signals to the microprocessor indicating whether the ram is fully contracted, fully extended or somewhere between. If the ram is down, the valve connected to the upper portion of the ram is energized to pressurize the ram above the piston and thereafter the valve connected to the lower ram portion is de-energized to contract the ram. If the ram is home, which it is during the film unload cycle as will later be described, the lower portion of the ram is repressurized by de-energizing the valve connected thereto. If the ram is neither fully contracted nor fully extended, the operator is alerted to manually position the ram at one extreme or the other.

When it is desired to remove film from the TAB framer it is put through a film unload cycle as set forth in the following Table 7.

TABLE 7

FILM UNLOAD CYCLE

1. Operator holds film 148 in left hand and
   pushes load (set up) button with right
2. Operator removes film 148 by rewinding
   to film supply reel 384
3. Operator pushes load (set up) button
4. Close stationary clamp 193
5. Sense position of film pick ram 136
   A. If down: Force down and then home
   B. If home: Force home
   C. if neither: Alert operator to
      correct and push load button again
      to retry step 5

It will be noted that the film unload cycle is the same program, i.e., the machine is cycled through the same steps, as the film load cycle. First the operator pushes the set up button which, as before, opens stationary clamps 193. The valve associated with the moveable film clamp maintains moveable clamp 201 in the open position when the valve is de-energized and thus film can be rewound onto supply reel 384 by manually rotating the supply reel. The operator then pushes the set up button a second time which, as before, closes stationary clamp 193, i.e., returns the valve associated therewith to its un-energized condition. Step 5 in the film unload cycle corresponds to step 8 in the film load cycle.

Figure 26:
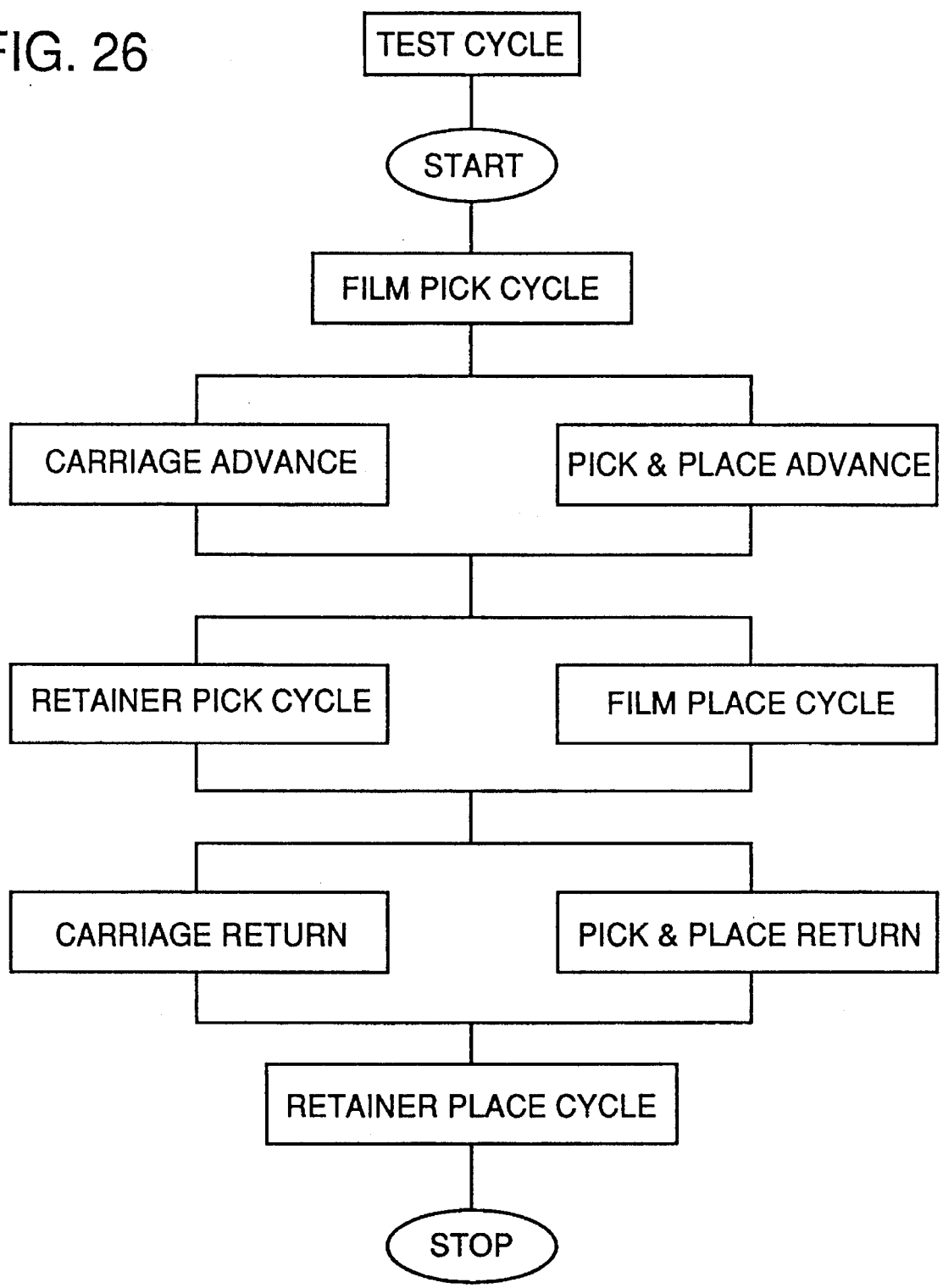
FIGS. 26 and 27 are flow charts illustrating operation cycles of the preferred embodiment of the present invention.

Consideration will now be given to the flow chart shown in FIG. 26 which illustrates a test cycle of the TAB framer performed after film is first loaded, using the film load cycle set forth in Table 6. The operator pushes the start button in FIG. 25 D which signals the microprocessor to first perform a film pick cycle as set forth in Table 2. At the completion of the film pick cycle, carriage 132 is at its right most position (in FIG. 14) and rams 134, 136 are in their contracted or upper positions with pick up head 140 holding a TAB segment on the lower end thereof. Next, two steps are performed substantially simultaneously, namely rotary actuator 150 is energized, responsive to microprocessor energization of the valve (in FIG. 24) connected to the rotary actuator. Such actuation moves carriage 132 to the position shown in FIG. 14. Substantially simultaneously therewith, rotary actuator 256 operates responsive to energization of its associated valve. So operating actuator 256 moves actuator shaft 254 (in FIGS. 11-13) from the position shown in FIGS. 11 and 12 to the position shown in FIG. 13. Such movement a) advances new film over bed knife 342 by lateral movement of the moveable film clamp along guide rods 310, 312 (in FIG. 16); b) draws a retainer member from the lower end of stack 162 in bin 118 and leaves it in position of retainer 142 in FIG. 11; and c) draws a body member from the lower end of stack 180 in bin 116 and leaves it in the position of body member 144 in FIG. 12, all as previously described in connection with the operation of structure illustrated in FIGS. 11-13. After both the carriage advance and pick and place advance cycles, as shown in FIG. 26, are complete, a retainer pick cycle and a film place cycle are substantially simultaneously performed. Thus, ram 134 extends to the position illustrated in FIG. 14 and picks up a retainer by way of vacuum action on the lower end of pick up head 138. Substantially simultaneously, the film segment on the lower end of pick up head 140 is lowered and placed into body member 144 by removing vacuum action from the lower end of pick up head 140 as called for in the film place cycle. Thus, after performing the retainer pick cycle and film place cycle both rams are again contracted.

Next, a carriage return cycle and a pick and place return cycle is performed. These cycles are performed by substantially simultaneously moving the rotary actuators 150, 256 to their other position. In addition, rams 242, 290 (in FIGS. 11, 12 and 24) are extended thus causing cams 244, 292 to lower advance bars 214, 258, respectively, as previously described. Extension of rams 242, 290 occurs prior to operation of rotary actuator 256 to enable the advance bars to clear retainer member 142, body member 144 and the members on the lower ends of each of the bins as the advance bars are returned to the positions illustrated in FIGS. 11 and 12.

Next, a retainer place cycle is performed thus lowering ram 134, and the retainer member on the lower end of pick up head 138, into body member 144 and interlocking the retainer and body members over the film as previously described herein. At the end of the retainer place cycle ram 134 is contracted thus leaving a framed TAB segment adjacent bin 116. At this point the microprocessor is programmed to stop the test cycle. Assuming the machine functions properly during the test cycle the start button, in FIG. 25D is pushed thus initiating the automatic cycle illustrated in the flow chart in FIG. 27.

The automatic cycle is the same as the test cycle through the substantially simultaneous performance of the carriage return and pick and place return cycles. Thereafter, if the stop button, in FIG. 25D, is pushed, the microprocessor immediately stores a flag, which if present at the end of the carriage return and pick and place return cycles causes the TAB framer to operate in accordance with the steps in the stop path, namely a retainer place cycle, as illustrated in Table 5, and then stopping further operation of the TAB framer.

Figure 27:
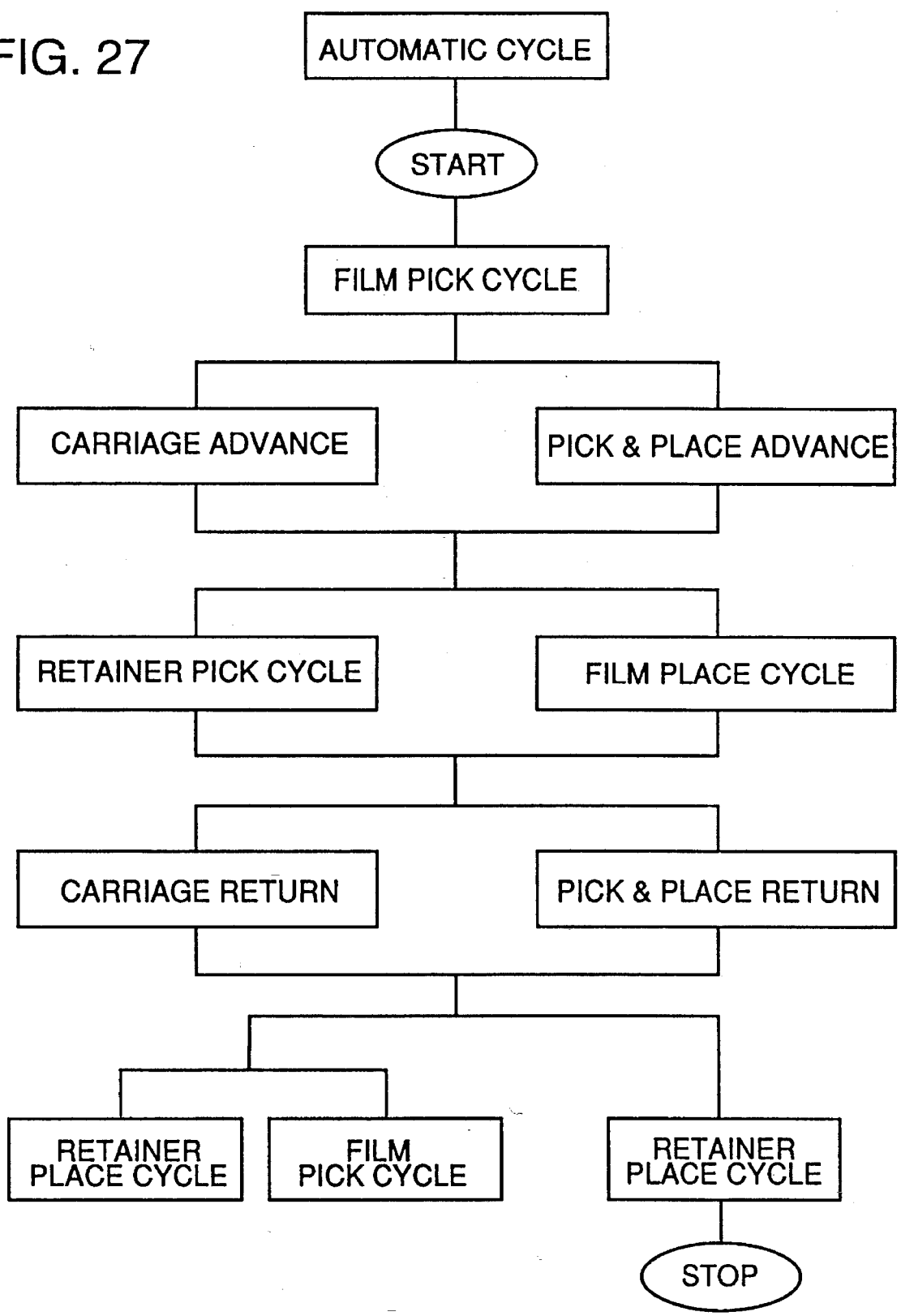

If no stop flag is present, operation proceeds in accordance with the cycles on the continue path branch of the flow chart. That is, a retainer place cycle, which interlocks a retainer suspended on the lower end of pick up head 138 with the carrier member, having a TAB segment therein, located beneath the pick up head. This is the same as the next to last step in flow chart 26 in the test cycle; however, in the automatic cycle, a film pick cycle, in Table 2, is substantially simultaneously performed with the retainer place cycle and thereafter the automatic cycle continues at the beginning of the carriage advance and pick and place advance cycles. Thus, when ram 134 lowers to interlock a retainer member with the body member therebeneath thereby forming a framed TAB segment, ram 136 simultaneously lowers to pick up a film segment. Thereafter operations continue with substantial simultaneous performance of the carriage advance and pick and place advance cycles as shown in FIG. 27. The automatic cycle thus continues indefinitely until an error condition is detected by a position sensor, such as improper movement of a rotary actuator shaft, until all the film is used up, or until the stop button is pressed.

As framed TAB segments are completed one-by-one, each successive carriage advance moves the framed TAB segment or carrier successively to the right (in FIG. 12), as shown for carrier 184, and ultimately draws completed carriers onto the lower end of stack 182 in bin 120 as previously described.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. An apparatus for framing a tape-assisted bonding (TAB) segment in a TAB carrier of the type having first and second carrier members which are engagable with one another for framing the TAB segment therebetween, said apparatus comprising:

a loading station for supporting a first TAB carrier member; means for supporting a TAB segment on one side of said loading station; means for supporting a second TAB carrier member on another side of said loading station;

means for transferring a TAB segment from said TAB segment supporting means to said loading station;

means operatively associated with said TAB segment transferring means for transferring a second TAB carrier member from said second TAB carrier member supporting means to said loading station; and means for engaging the first and second carrier members with one another in said loading station thereby framing such a TAB segment therebetween.

2. The apparatus of claim 1 wherein said TAB segment supporting means and said second TAB carrier member supporting means are positioned on opposite sides of said loading station.

3. The apparatus of claim 1 wherein said first TAB carrier member comprises a body member having a rectangular cavity on one side thereof for receiving a TAB segment therein, said TAB segment is rectangular in shape and said second TAB carrier member comprises a retainer member shaped and sized to fit conformably within the cavity and cover a margin of the TAB segment and wherein said apparatus further includes means for positioning said TAB carrier body member in said loading station with the cavity exposed on one side and the body member supported on the opposite side.

4. The apparatus of claim 3 wherein said means for transferring a TAB segment to said loading station comprises means for inserting the TAB segment in the exposed cavity of a TAB carrier body member so received in said loading station.

5. The apparatus of claim 4 wherein said means for transferring a second TAB carrier member to said loading station comprises means for inserting said second TAB carder member in the cavity of a TAB carrier body member so positioned in said loading station over a TAB segment so received in said cavity.

6. The apparatus of claim 5 wherein said means for engaging first and second carrier members with on another comprises means for interlocking the body member and retainer member along opposed peripheries of the cavity and retainer member.

7. The apparatus of claim 1 wherein said apparatus further includes:

means operatively associated with said TAB segment supporting means for in-feeding a continuous strip of flexible film to a cutting station adjacent said loading station; and means operatively associated with said infeeding means for cutting such a TAB segment from said film.

8. The apparatus of claim 1 wherein said apparatus further includes:

means operatively associated with the loading station for in-feeding such a first TAB carrier member to said loading station; and means operatively associated with the second tab carrier supporting means for in-feeding such a second TAB carrier member to said second TAB carrier member supporting means.

9. The apparatus of claim 8 wherein said means for in-feeding such a TAB carrier body member comprises:

means for maintaining a stack of TAB carrier body members; and means for drawing a single body member off one end of the stack.

10. The apparatus of claim 9 wherein said stack is vertically oriented and wherein said drawing means comprises:

a wiping member for striking one edge of a body member on one end of the stack thereby drawing the body member off the stack;

means for moving said wiping member back and forth in a horizontal direction adjacent one end of said stack; and means for changing the vertical disposition of said wiping member between a first position in which said wiping member draws a body member off the stack responsive to horizontal wiping member movement in one direction and a second position in which horizontal wiping member movement in the other direction occurs without striking the stack.

11. The apparatus of claim 8 wherein said means for in-feeding such a TAB carrier retainer member comprises:

means for maintaining a stack of TAB carrier retainer members; and means for drawing a single retainer member off one end of the stack.

12. The apparatus of claim 11 wherein said stack is vertically oriented and wherein said drawing means comprises:

a wiping member for striking one edge of a retainer member on one end of the stack thereby drawing the retainer member off the stack;

means for moving said wiping member back and forth in a horizontal direction adjacent one end of said stack; and means for changing the vertical disposition of said wiping member between a first position in which said wiping member draws a retainer member off the stack responsive to horizontal wiping member movement in one direction and a second position in which horizontal wiping member movement in the other direction occurs without striking the stack.

13. An apparatus for framing a tape-assisted bonding (TAB) segment in a TAB carrier of the type having first and second carrier members which are engagable with one another for framing the TAB segment therebetween, said apparatus comprising:

a row of stations comprising a TAB segment station, a first carrier member station and a second carrier member station;

means operatively associated with said stations for in-feeding a TAB segment, a first carrier member and a second carrier member into the respective stations thereof;

a carriage laterally shiftable over said stations;

pickup means mounted on said carriage and being constructed and arranged to selectively pick up and release a TAB segment or carrier member contained in a station over which the pickup means is positioned;

means operatively connected to said carriage and said infeeding and pickup means for coordinating carriage movement and operation of said in-feeding and pickup means to create a stack in one of said stations which includes a first carrier member laying on one side thereof, a TAB segment having one side thereof positioned on the upper side of said first carrier member, and a second carrier member having one side thereof facing the upper side of the first carrier member and with the TAB segment therebetween; and means mounted on said pickup means for compressing a stack so created thereby engaging the carrier members with one another and framing the TAB segment therebetween.

14. The apparatus of claim 13 wherein said apparatus further includes a pair of vertically shiftable arms mounted on said carriage, said pickup means being mounted on the lower end of each of said arms and said arms being positioned over the first and second stations when said carriage is in a first lateral position and being positioned over the second and third stations when said carriage is in a second lateral position.

15. The apparatus of claim 13 wherein said first carrier member station is between the other two stations.

16. The apparatus of claim 13 wherein said means for in-feeding a TAB segment further comprises:

means operatively associated with said TAB segment supporting means for in-feeding a continuous strip of flexible film to a cutting station adjacent said loading station; and means operatively associated with said infeeding means for cutting such a TAB segment from said film.

* * * * *